(12) United States Patent
Choi et al.

(10) Patent No.: US 6,838,645 B2
(45) Date of Patent: Jan. 4, 2005

(54) HEATER ASSEMBLY FOR MANUFACTURING A SEMICONDUCTOR DEVICE

(75) Inventors: Chul-Hwan Choi, Seoul (KR); Jin-Ho Jeon, Seoul (KR); Yong-Gab Kim, Gyeonggi-do (KR); Sung-Hwan Jang, Gyeonggi-do (KR); Dong-Won Lee, Seoul (KR); Min-Woo Lee, Seoul (KR); Kyung-Tae Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 84 days.

(21) Appl. No.: 10/267,549

(22) Filed: Oct. 8, 2002

(65) Prior Publication Data

US 2003/0080109 A1 May 1, 2003

(30) Foreign Application Priority Data

Oct. 19, 2001 (KR) ........................................ 2001-64808

(51) Int. Cl.$^7$ ................................................ H05B 3/68
(52) U.S. Cl. ..................... 219/444.1; 118/724; 219/544
(58) Field of Search .................... 219/443.1, 444.1, 219/465.1, 466.1, 467.1, 468.1, 468.2, 544, 546; 118/724, 725

(56) References Cited

U.S. PATENT DOCUMENTS

| | | | |
|---|---|---|---|
| 4,981,815 A | | 1/1991 | Kakoschke |
| 5,059,770 A | * | 10/1991 | Mahawili ..................... 219/391 |
| 6,032,211 A | | 2/2000 | Kewitt |

* cited by examiner

*Primary Examiner*—Sang Y. Paik
(74) *Attorney, Agent, or Firm*—Marger Johnson & McCollom, P.C.

(57) ABSTRACT

A heater assembly that is capable of uniformly heating a wafer in an apparatus for manufacturing a semiconductor device is provided. The heater assembly preferably includes a susceptor configured to support a substrate (wafer). A plurality of heaters can be disposed under the susceptor to heat the wafer. A support is preferably disposed below the heaters to support the heaters, and a power supply provides an electric current to operate the heaters. The support can include a heat-shielding portion that restricts heat conduction between the heaters. The heat-shielding portion preferably comprises heat-resistant material arranged in a groove formed on the support. The heat-shielding portion also preferably supports adjacent peripheral portions of the heaters. Electrical current provided to the heaters is preferably controlled such that the temperature of the heaters are operated in a range of about 390° C. to 420° C. Alternatively, a single or multiple ring-shaped heaters having an internal radiating space can be provided below a peripheral portion of the susceptor to uniformly heat the wafer.

14 Claims, 35 Drawing Sheets

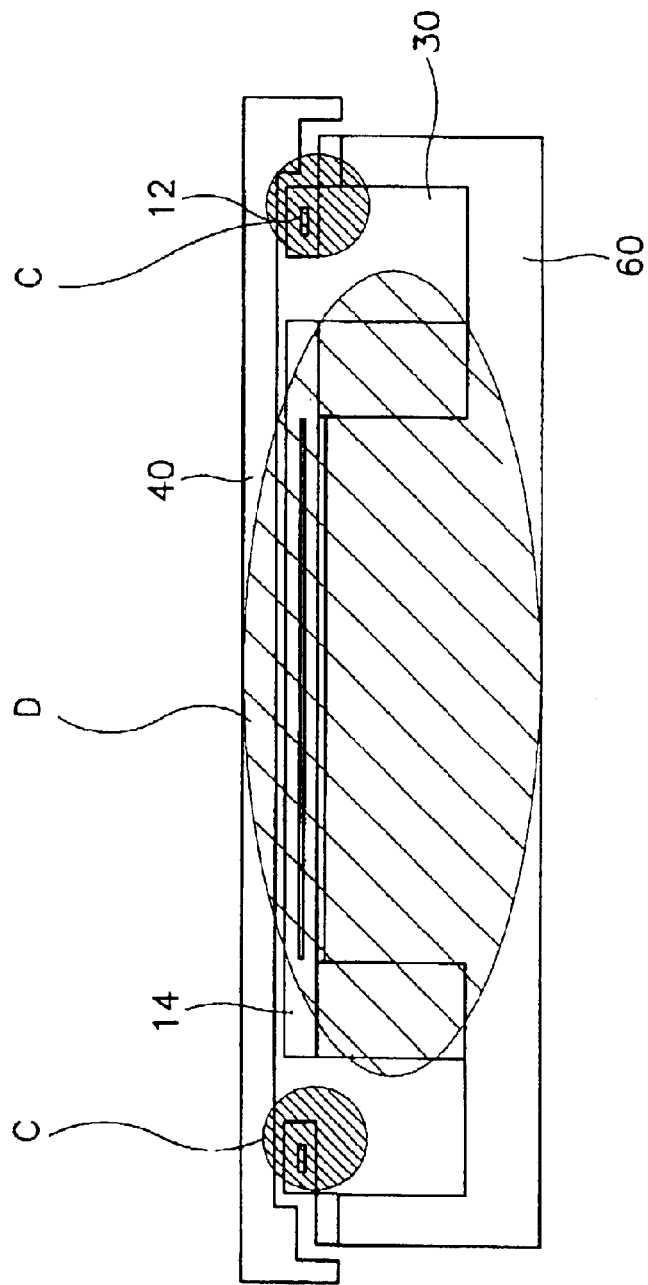

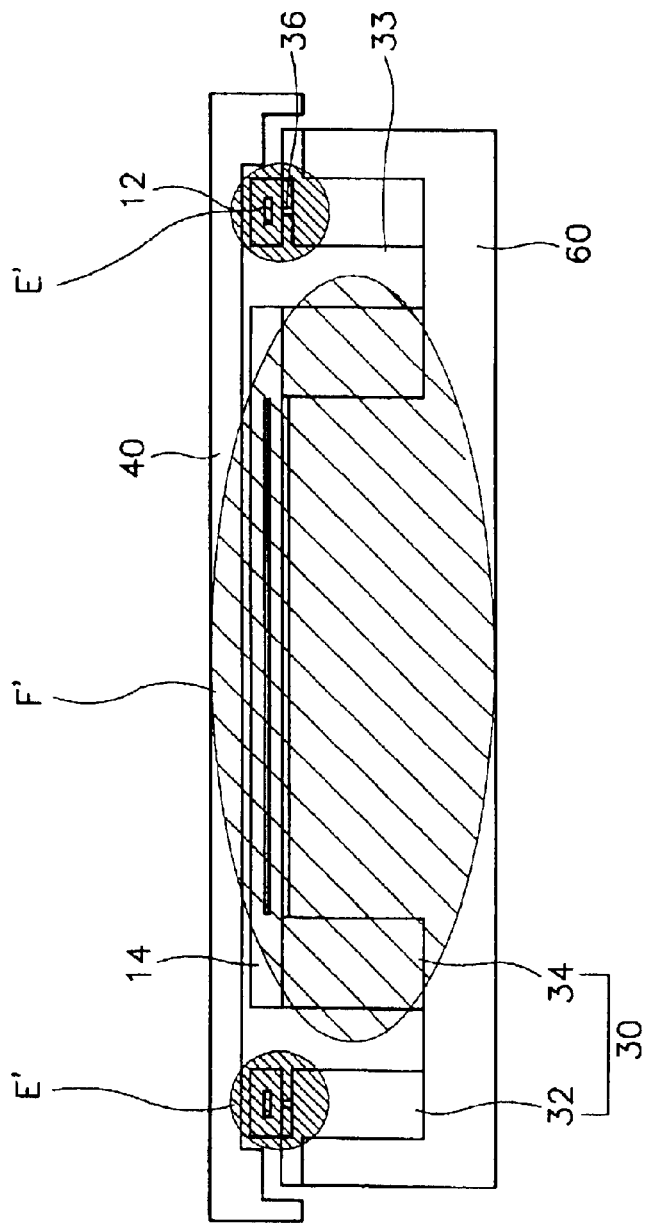

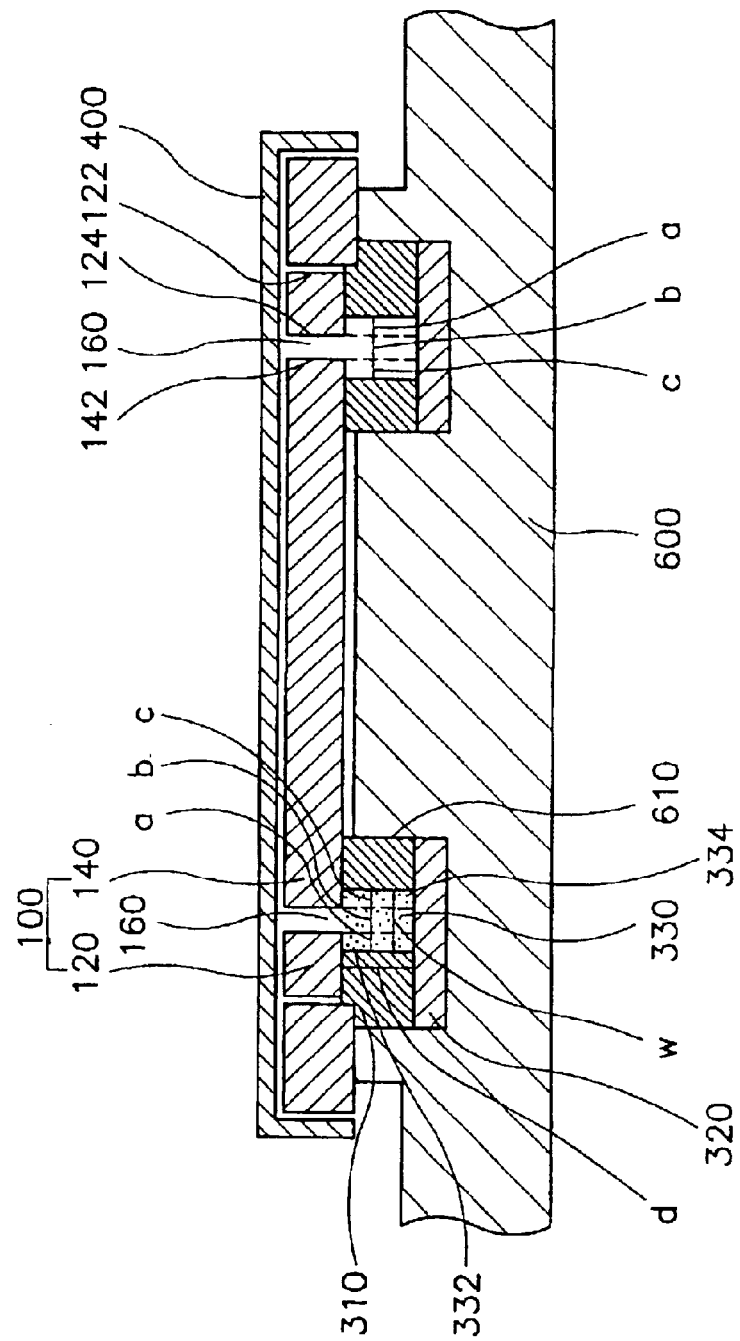

FIG. 17

| DEPOSITION TEMPERATURE | 400°C | 405°C | 410°C | 415°C |
|---|---|---|---|---|
| ILS PHOTOGRAPH OF GRAINS | (810) | | | |
| RI/RANGE | 122/0.59 | 119/0.67 | 113/7.77 | 109/10.25 |

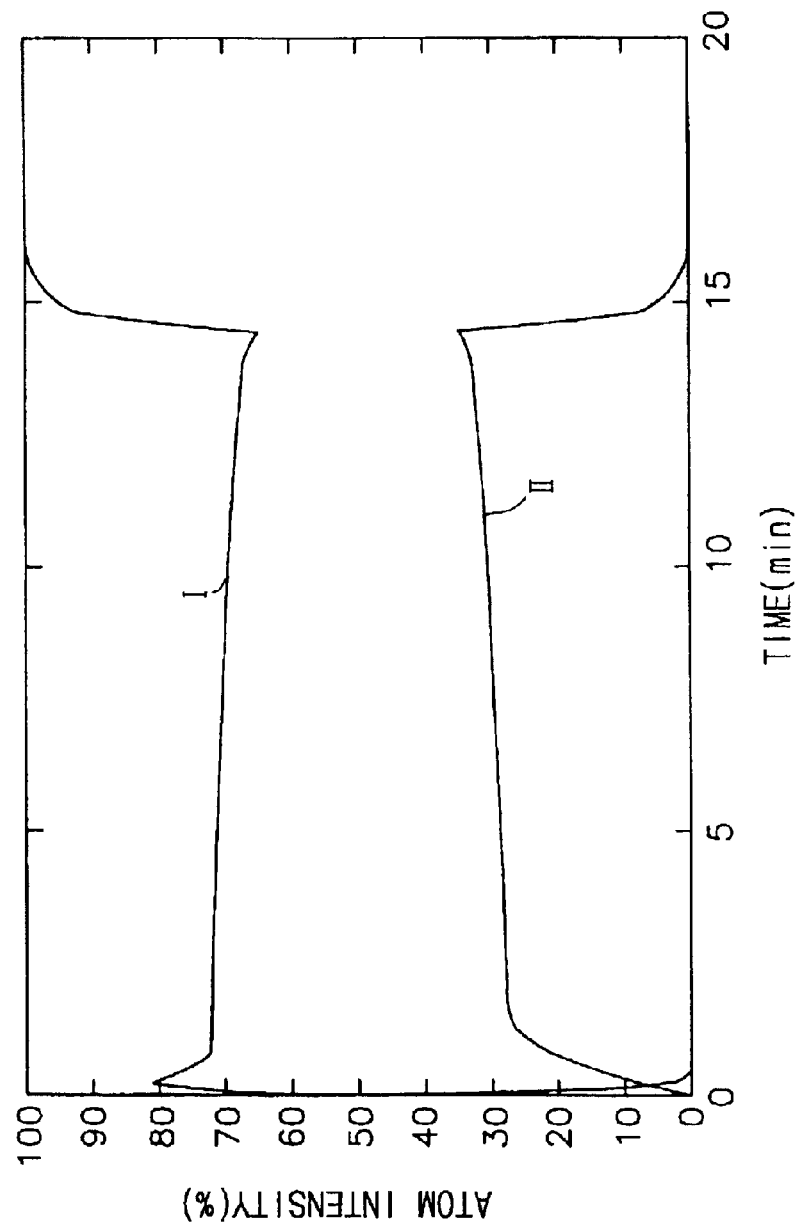

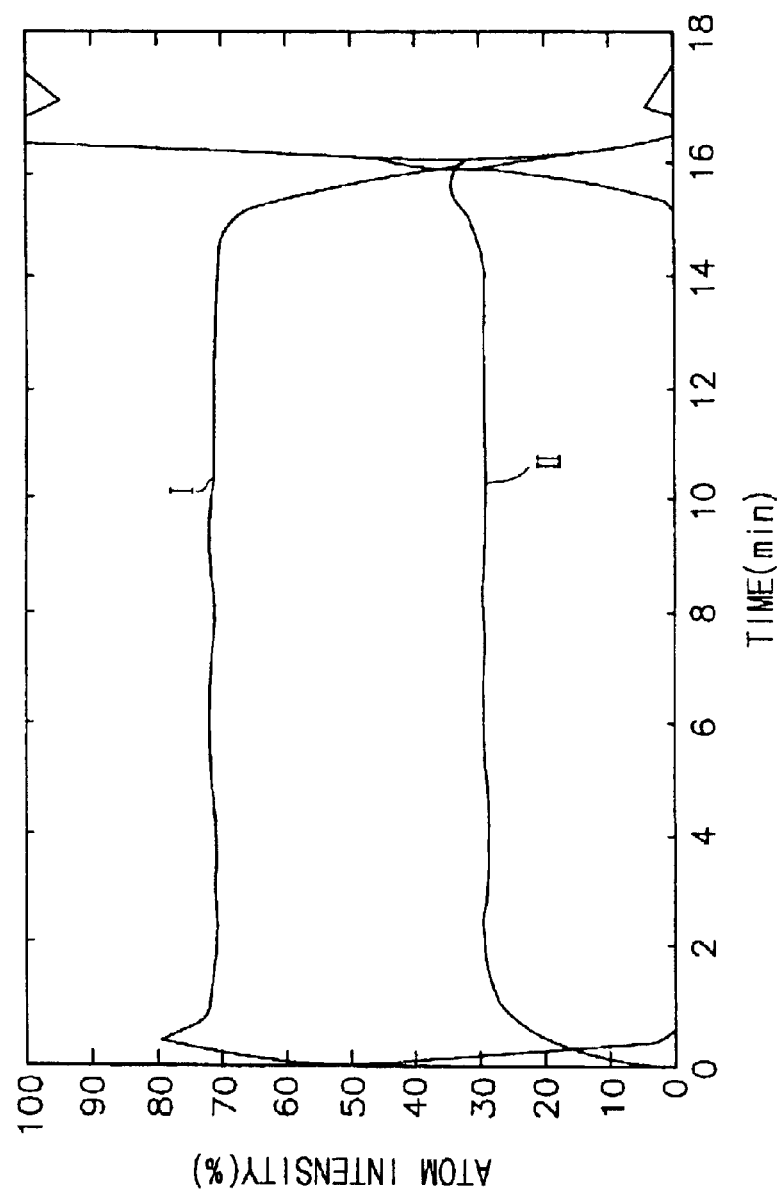

HEATER ASSEMBLY FOR MANUFACTURING A SEMICONDUCTOR DEVICE

This application claims priority from Korean Patent Application No. 2001-64808, filed Oct. 19, 2001, the contents of which are incorporated herein by reference in their entirety.

BACKGROUND OF THE INVENTION

1. Field of the Invention

The present invention relates generally to a heater assembly for providing a uniform temperature distribution, and more particularly to a heater assembly used in semiconductor device fabrication to provide a uniform temperature distribution across a wafer surface.

2. Description of the Related Art

A conventional semiconductor device is manufactured by forming a minute electronic circuit pattern on a substrate. The circuit pattern comprises wirings connecting numerous electronic elements. In particular, a silicon wafer (i.e., a small thin circular slice of pure silicon) is produced from an ingot of crystalline silicon. An electronic circuit is then formed on a surface of the wafer through a wafer fabrication (e.g., FAB) process. The wafer is next cut into a plurality of individual chips, and each chip is combined with a lead frame. An operating test can then be performed on the chip to ensure that the semiconductor device is fully functional.

During the FAB process, a thin film is first formed on the surface of the wafer during a deposition process. The film is then patterned to form an electronic circuit capable of performing a specific function. If the thickness of the thin film is not uniform over the entire surface of the wafer, a variety of process failures may occur, resulting in improper formation of the integrated circuit pattern.

The rate at which the material comprising the thin film is deposited on the wafer depends in large part on the temperature of the wafer. Specifically, when all other deposition conditions are held constant, the thin film is formed more quickly and hence more thickly on a wafer surface at a high temperature than at a low temperature. The deposition process is carried out while the wafer is repeatedly heated and cooled and the temperature can vary across the wafer surface, especially between a peripheral portion and a central portion of the wafer. Accordingly, the thin film may be formed non-uniformly over the wafer surface resulting in various film thickness, composition, and electrical resistance across the surface of the wafer. An integrated circuit patterned on the non-uniform thin film may consequently lose its functional stability. Temperature uniformity is therefore an essential factor in manufacturing a semiconductor device that has functional stability.

The recent trend in semiconductor technology is to provide devices having higher degrees of integration. This can be accomplished, for instance, by reducing the critical dimension of the circuit patterns thereof. Accordingly, temperature uniformity of the wafer surface is becoming increasingly important during the semiconductor device manufacturing process. Tungsten silicide (WSi) in particular, which is a popular wiring material in devices having a high degree of integration, is greatly influenced by temperature during the manufacturing process. Temperature uniformity on the wafer surface is even more important, therefore, when tungsten silicide or other temperature-sensitive materials are used for the wiring material.

Chemical vapor deposition (CVD) is conventionally used to form the thin film during the semiconductor device manufacturing process. Thermal CVD is frequently for forming such thin films. In the thermal CVD process, material is deposited through heat-induced chemical reactions of reactant gases supplied to a surface of a heated wafer. Thermal CVD processes are classified into atmospheric pressure CVD (APCVD) and low pressure CVD (LPCVD) processes based on the pressure in the CVD apparatus. LPCVD is especially suitable for depositing a metal silicide having a high melting point (such as tungsten silicide (WSi)) to form a polycide that can be used as a wiring material in a highly integrated circuit device.

An LPCVD apparatus includes a susceptor for supporting and fixing a wafer on an upper surface thereof, and a heater disposed below the susceptor to provide heat to the susceptor. More specifically, heat generated by the heater radiates to the susceptor and is conducted from the susceptor to the wafer. The temperature of the wafer surface is therefore dependent on the amount of heat conducted from the susceptor, and the conducted heat from the susceptor is mainly dependent on the amount of heat radiating from the heater. In other words, the temperature of the wafer surface is mainly dependent on the amount of heat radiating from the heater.

Unfortunately, however, even though an equal amount of heat is radiated to both the peripheral and the central portions of the wafer from the heater, the surface temperature at the peripheral portion of the wafer is generally lower than at the central portion of the wafer. This is because a significant amount of heat is lost from a side surface of the peripheral portion of the wafer. A larger amount of heat is therefore conserved at the central portion of the wafer and the surface temperature of the wafer is consequently much lower at the peripheral portion than at the central portion of the wafer.

Various attempts have been made to modify the structure of the heater assembly to reduce the temperature difference between the central and peripheral portions of the wafer. U.S. Pat. No. 6,032,211, for example, discloses a method for producing temperature uniformity at the surface of the wafer. The disclosed heating system includes a plurality of heating sections that are controlled independently to generate different amounts of heat for heating respective portions of the wafer. U.S. Pat. No. 4,981,815, entitled "METHOD FOR RAPIDLY THERMALLY PROCESSING A SEMICONDUCTOR WAFER BY IRRADIATION USING SEMICONDUCTOR OR PARABOLIC REFLECTORS", discloses a method for making the surface temperature of the wafer uniform by applying more heat to the peripheral portion of the wafer than to the central portion of the wafer.

A widely used thermal assembly CVD apparatus (GENUS 7000) made by GENUS Co. Ltd. U.S.A includes an inner heater for heating a central portion of a susceptor and an outer heater for heating a peripheral portion of the susceptor to provide temperature uniformity on the surface of the wafer. The inner heater and outer heater are discrete (i.e., separated) from each other and are independently controlled to generate more heat at the peripheral portion than at the central portion. The increased heat emitted from the outer heater attempts to compensate for the heat loss at the side surface of the peripheral portion of the wafer. Unfortunately, however, the dual heater system does not provide temperature uniformity even when the outer heater generates more heat than the inner heater.

FIG. 1 is a schematic cross-sectional view showing a conventional dual heater system 90 of the GENUS 7000 thermal CVD apparatus. FIG. 2 is a schematic plan view of the dual heater system shown in FIG. 1. Referring to FIGS. 1 and 2, the conventional dual heater system 90 includes a susceptor 40 for supporting a wafer 50. A plurality of heaters 10 are disposed below the susceptor 40 to provide heat to the susceptor 40. An electrical power source supplies electric current to the heaters 10. A support 30 supports the heaters 10.

The heaters 10 include an outer heater 12 for heating a peripheral portion of the susceptor 40 and an inner heater 14 for heating an inner portion of the susceptor 40. The outer heater 12 and the inner heater 14 are separated from each other by a space 16 for preventing heat transfer between the outer heater 12 and the inner heater 14. In addition, the outer heater 12 and the inner heater 14 are controlled to operate independently. The inner heater 14 provides heat to most of the susceptor 40, and the outer heater 12 provides heat to the peripheral portion of the susceptor 40 along an outer circumference of the susceptor 40.

Each of the heaters 10 is made of a thin plate of graphite. Heat is generated using the internal resistance of the heaters 10 when the electric current is supplied to the heaters 10. The electrical power source includes a first source for providing current to the outer heater 12 and a second source 20 for providing current to the inner heater 14. The support 30 operates as an insulator and is not easily corroded by deposition gas or other pollutants. The support can be made of quartz, which is corrosion-resistant to acid or alkali materials except hydrogen fluoride and is very chemically stable.

When electric current is provided to the heaters 10 from the power source, heat generated from the graphite heaters 10 radiates to the susceptor 40. Heat is then conducted from the susceptor 40 to the wafer 50 disposed on top of the susceptor 40, thereby heating the wafer 50. The outer heater 12 is controlled to generate more heat than the inner heater 14.

Experiments have shown, however, that the temperature of the wafer surface varies significantly from the central portion to the peripheral portion of the wafer despite the provision of a dual heater assembly. FIG. 3 shows temperature distribution across the surface of a wafer heated by the conventional dual heater system of FIGS. 1 and 2. The results shown in FIG. 3 were obtained by measuring the temperature at 25 spots on a test (T/C) wafer during a tungsten silicide deposition process in the GENUS 7000 apparatus. During the deposition process, the internal pressure of the process chamber was maintained at 300 mtorr, and the temperatures of the outer heater and the inner heater were respectively set at 387° C. and 377° C.

As shown in FIG. 3, even though the outer heater 12 was controlled to generate more heat than the inner heater 14, the temperature of wafer surface was relatively high at the central portion of the wafer and relatively low at the peripheral portion of the wafer. The temperature difference between the highest temperature (TC13) and the lowest temperature (TC10) was 8.8° C. Accordingly, the results shown indicate that the dual heater system is insufficient to provide uniform temperature of the wafer surface.

Other experiments were also performed to find out whether or not generating more heat from the outer heater than the inner heater can reduce the temperature difference in the wafer surface. In another experiment, for example, the temperature of the outer heater is raised significantly without changing the temperature of the inner heater.

FIGS. 4A to 4D show the temperature distribution across the surface of a wafer heated by the conventional dual heater system of FIGS. 1 and 2 as the temperature of the outer heater was set to four different temperatures (375° C., 395° C., 415° C., and 450° C., respectively) while the inner heater temperature was kept constant. The temperature was measured at 25 spots on a test wafer in the GENUS 7000 apparatus having the conventional dual heater system. During each of these experiments, the temperature of the inner heater was set at 405° C.

Referring to FIGS. 4A to 4D, the results of the experiments show that even though the temperature of the inner heater was kept constant, the temperature of the central portion of the wafer increased as the temperature of the outer heater increased. In other words, the temperature difference between the central portion and the peripheral portion of the wafer is not significantly reduced through the use of separate heaters even when the amount of heat supplied by the outer heater increases. In these experiments, for example, even though the temperature of the outer heater was varied, the temperature differences between the highest and lowest temperature of the wafer surface were almost the same.

As described above, the conventional dual heater system does not provide sufficiently uniform temperature distribution across the surface of the wafer despite the ability to separately control the temperature of heaters used to heat the central and peripheral portions of the susceptor. Rather, experiments show that the temperature of the central portion of the susceptor is increased when the temperature of the peripheral portion is raised. Changing the structure and shape of the heater therefore does not guarantee temperature uniformity on the wafer surface. If the wafer surface temperature is non-uniform, the thickness of the thin film formed on the wafer surface will also be non-uniform. It would therefore be desirable to have a wafer heating system that provides a more uniform temperature across the surface of the wafer.

SUMMARY OF THE INVENTION

The present invention solves the above problems by supplying a heater assembly that enables temperature uniformity across a wafer surface.

More particularly, a heater assembly preferably includes a first supporting member for supporting the object. Heating elements are arranged below the first supporting member to heat the object. The heating elements are thermally isolated from each other by isolating spaces. A second supporting member is disposed below the heating elements to support the heating elements. The second supporting member includes a heat-shielding portion that masks heat conduction between the heating elements through a conducting medium. The heat-shielding portion preferably comprises heat-resistant material inserted in a groove that is formed on a surface of the second support. The heat-shielding portion supports a peripheral portion of the adjacent heating elements separated by the isolating space.

In another embodiment, the heater assembly includes a first supporting member for supporting the object. A heating element is disposed under the first supporting member to heat a peripheral portion of the first supporting member. The heating element is preferably configured in a ring shape and includes a continuous radiating space for heat transfer therein. A second supporting member is disposed beneath the heating element to support the heating element. The second supporting member radiates heat from the heating element through the radiating space to heat a lower surface of the first supporting member.

In yet another embodiment, a heater assembly of a manufacturing apparatus for semiconductor device includes a susceptor for supporting a wafer. A plurality of heaters are disposed under the susceptor to heat the wafer. The heaters are separated by isolating spaces that thermally isolate the heaters from one another. A support is disposed below the heaters to support the heaters. The support preferably includes a heat-shielding portion that masks heat conduction between the heaters. The heat shield portion can be a heat-resistant material inserted in a groove formed on a surface of the support. The heat-shielding portion can support a peripheral portion of adjacent heaters that are separated by the isolating space.

In a still further embodiment, a heater assembly includes a susceptor for supporting a wafer. A heater is arranged under the susceptor to heat a peripheral portion of the susceptor. The heater is preferably formed in a ring shape and includes a continuous radiating space for heat transfer. A support can be disposed beneath the heater to support the heater. The support radiates heat conducted from the heater through the radiating space to heat a lower surface of the susceptor.

According to various embodiments of the present invention, since heat conduction from the heater to the support is restricted, increasing the temperature of the outer heater does not significantly increase the temperature of central portion of the susceptor. In this way, a dual heater assembly can be used to ensure temperature uniformity across a wafer surface.

BRIEF DESCRIPTION OF THE DRAWINGS

The above and other objects, features and advantages of the present invention will become more apparent from the following detailed description of preferred embodiments thereof made with reference to the attached drawings, in which:

FIGS. 7A to 7C are schematic cross-sectional views of modified dual heater systems illustrating a temperature distribution thereof;

FIG. 10A is a cross-sectional view showing the support of the heater assembly of FIG. 9;

FIG. 17 provides a plurality of ILS photograph reproductions illustrating density variations of the tungsten silicide (WSix) grain due to changes of the heater temperature;

FIGS. 18A and 18B are graphs showing results of an AES test when the temperature of the heater is 405° C.; and FIGS. 19A and 19B are graphs showing results of an AES test when the temperature of the heater is 395° C.

DESCRIPTION OF THE PREFERRED EMBODIMENTS

As demonstrated above, increasing the amount of heat emitted from the outer heater of the conventional dual heater assembly does not reduce the temperature difference between the inner portion and the central portions of the wafer sufficiently. In another experiment, the results of which are illustrated in FIG. 5, the conventional dual heater system was computer-simulated to determine why the temperature difference of the wafer surface does not decrease when the amount of heat emitted from the outer heater is increased.

Figure 5:
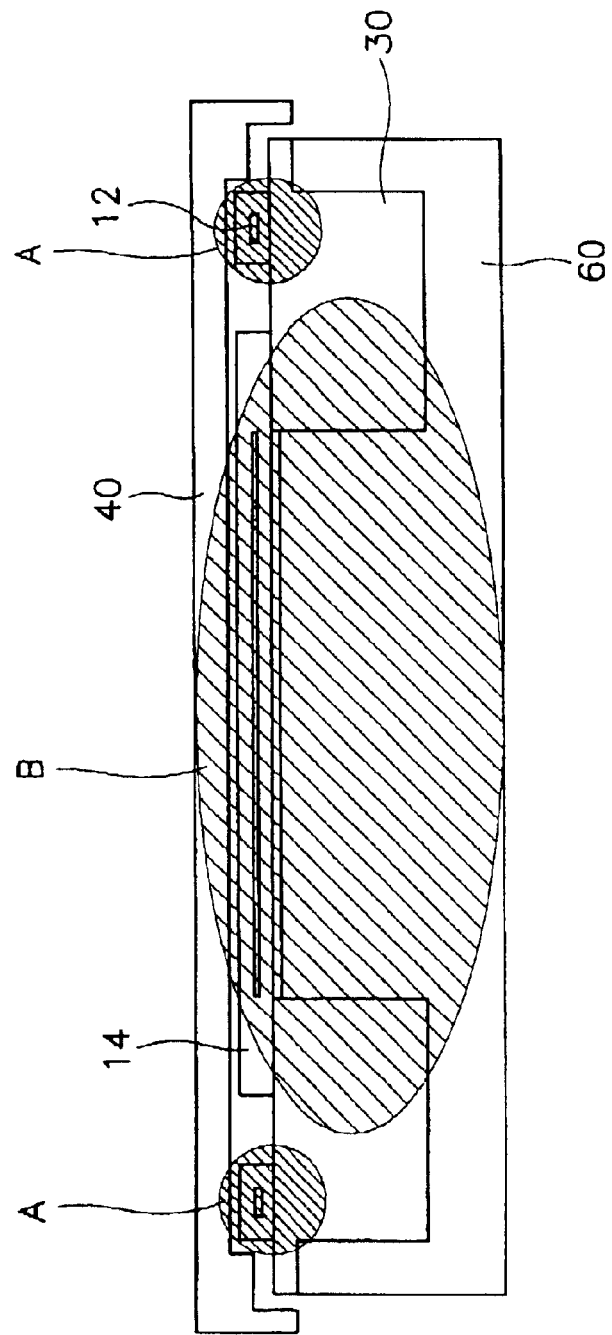
FIG. 5 is a schematic cross-sectional view of the conventional dual heater system of FIG. 1, illustrating a temperature distribution a heater assembly thereof.

FIG. 5 illustrates the temperature distribution of the conventional heater assembly including a dual heater system, analyzed by a Super-computer, wherein the temperature of the inner heater is set to 390° C. and the temperature of the outer heater is set to 450° C. Referring to FIG. 5, the dual heater system includes a support 30 for supporting the outer heater 12 and the inner heater 14. A susceptor 40 supports the wafer, and a heater cup 60 contains the support 30. In FIG. 5, regions of the same temperature are represented by the same reference symbol. Regions of different temperature are indicated using different reference symbols. The cross-hatching represents the temperature of the regions. The denser the cross-hatching, the higher the temperature.

An outer region (A), which includes the outer heater, has the highest temperature in the heater assembly. An inner region (B) includes the support 30, the inner heater 14, and the heater cup 60. The support 30 contacts both the outer heater 12 and the inner heater 14. As indicated by the similarity in cross-hatching, the inner region (B) has a temperature that is similar to that of the outer region (A) even though the temperature of the inner heater 14 is far lower than that of the outer heater 12.

It can therefore be concluded that heat is conducted from the outer heater 12 to the inner heater 14 through a medium of the support 30. When the amount of heat emitted from the outer heater is increased to attempt to make the surface temperature of the wafer uniform, the heat is conducted from the outer heater 12 to the inner heater 14 through the support 30. As a result, the surface temperature of the central portion of the wafer is raised as the heat from the outer heater 12 is increased. Accordingly, when the heater assembly is made such that the heater portions are arranged in direct contact with the support, dividing the heater into a plurality of separate mini-heaters and controlling one to emit more heat to a peripheral portion of the wafer than a central portion of the wafer does not reduce the temperature difference across the wafer surface.

Figure 1:
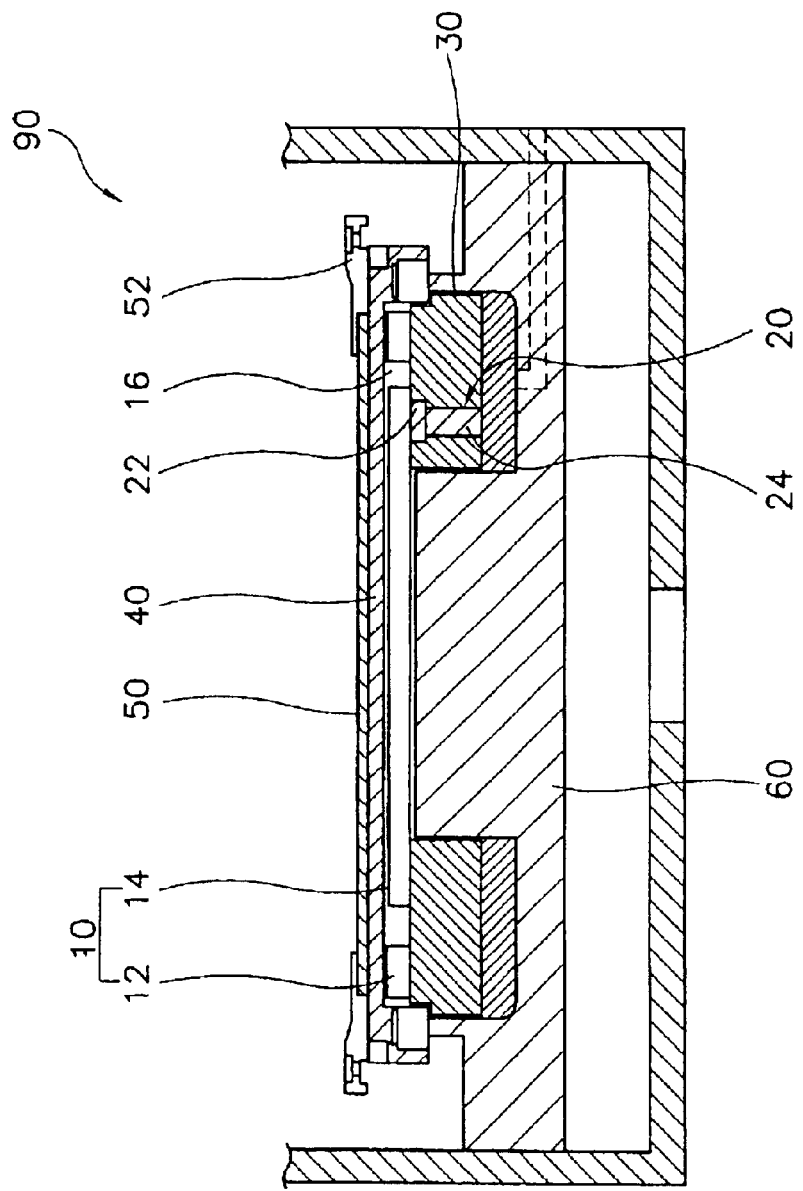
FIG. 1 is a schematic cross-sectional view of a conventional dual heater system in a CVD apparatus.
Figure 2:
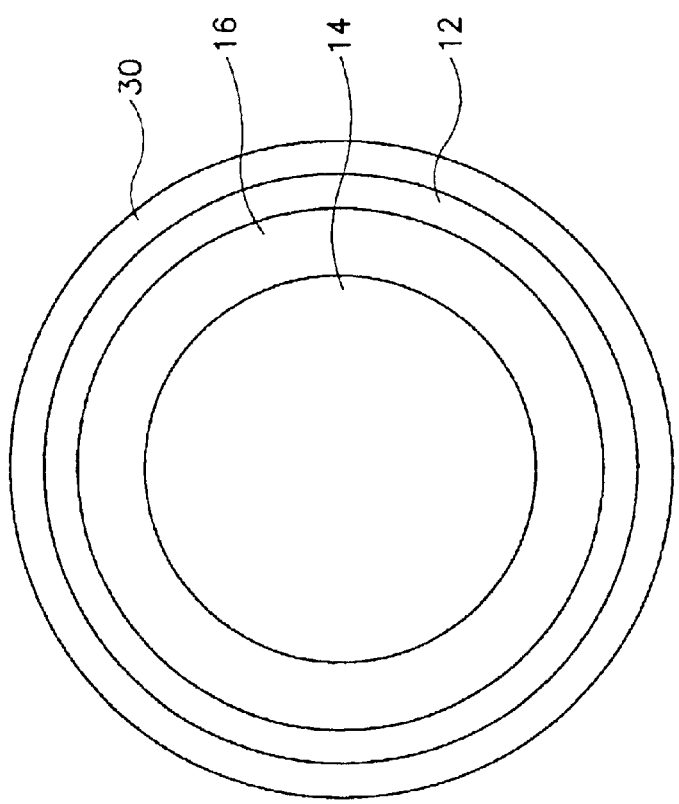
FIG. 2 is a schematic plan view of the dual heater system of FIG. 1.
Figure 3:
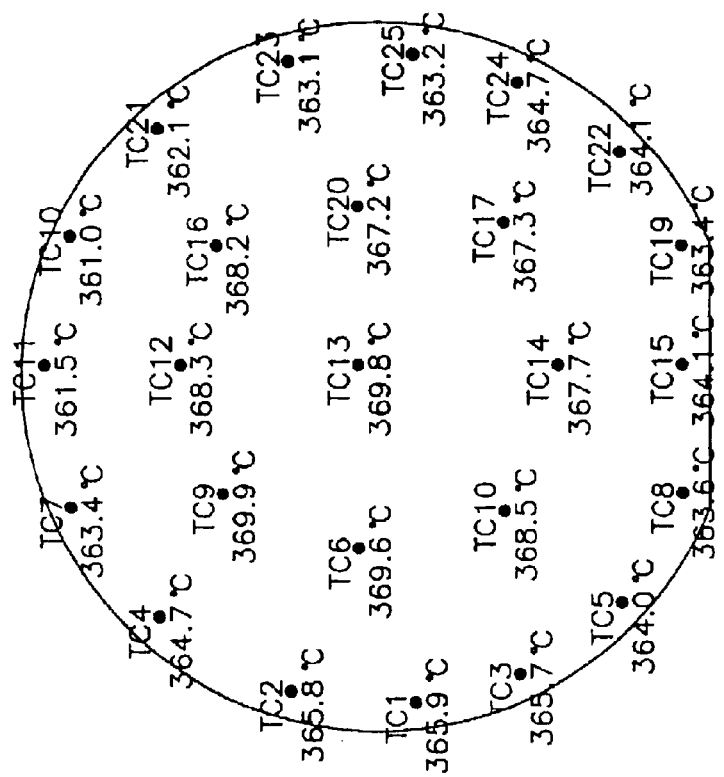
FIG. 3 is a diagram illustrating temperature distribution along the surface of a wafer heated using the conventional heater assembly of FIG. 1.
Figure 4A:
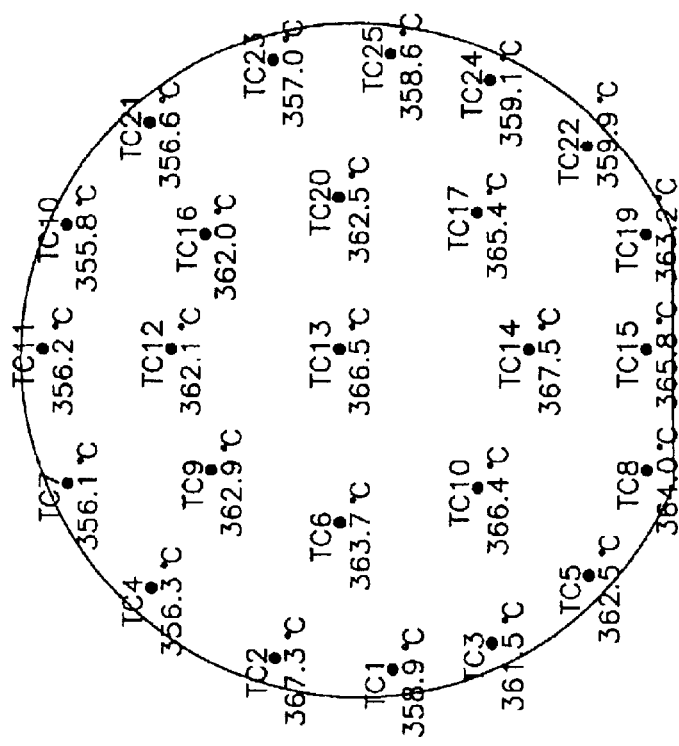
FIGS. 4A to 4D are additional diagrams illustrating the temperature distribution along the surface of a wafer heated by the conventional heater assembly of FIG. 1 under various operating conditions.
Figure 4B:
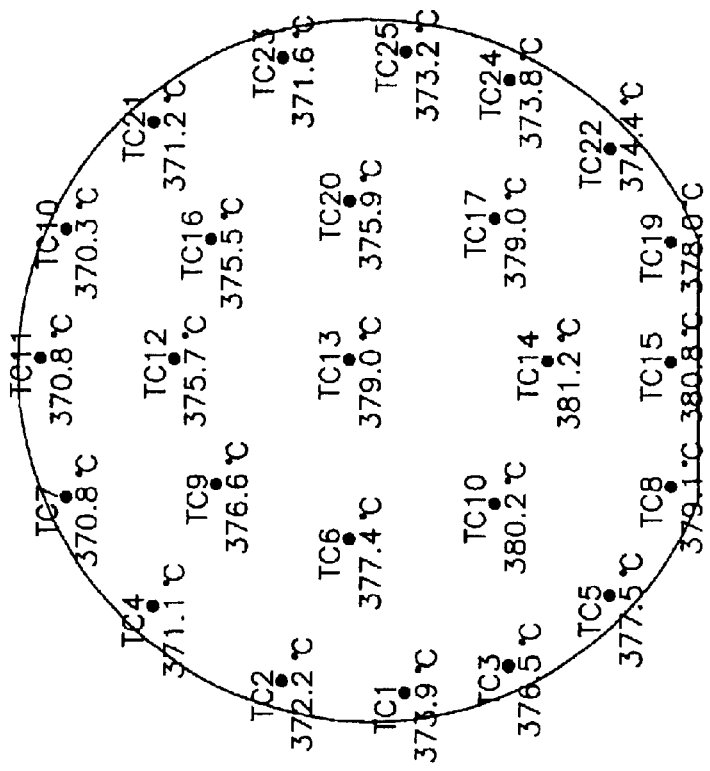
Figure 4C:
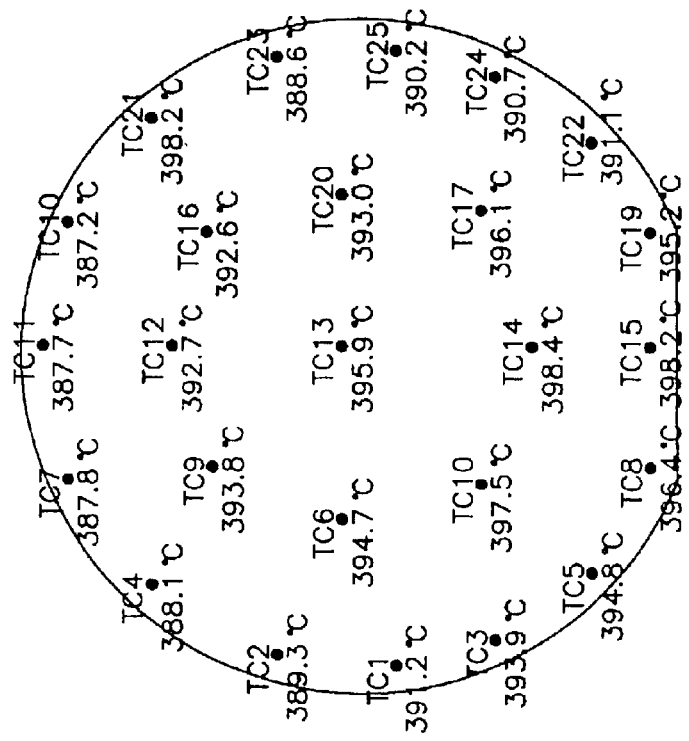
Figure 4D:
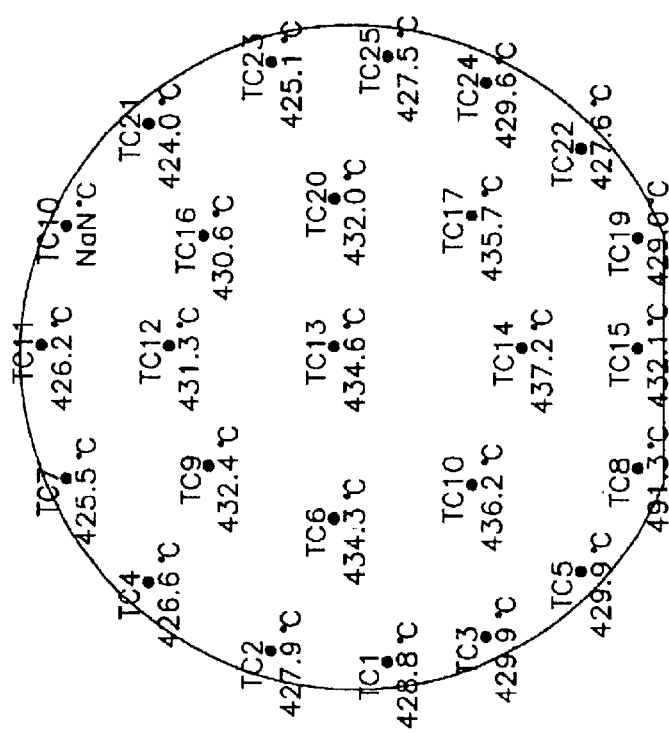
Figure 6:
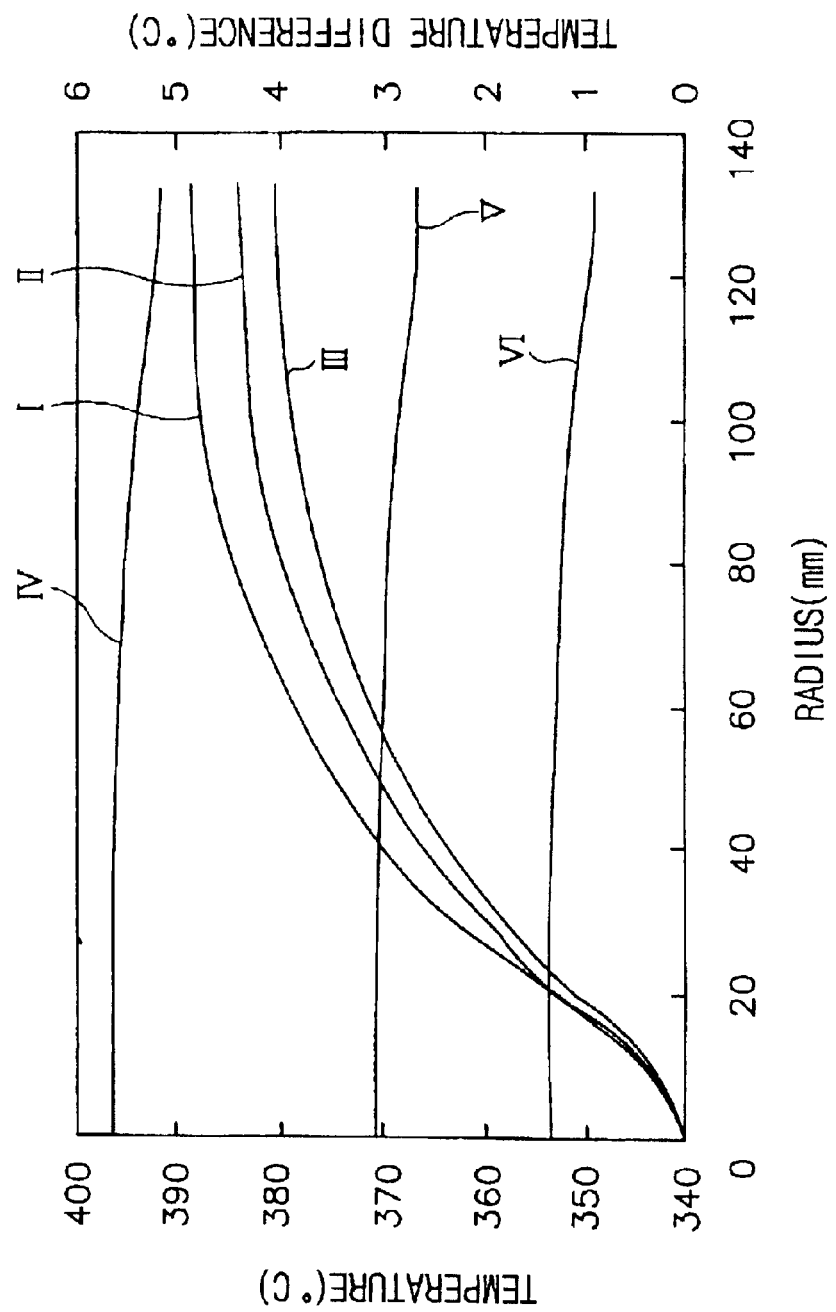
FIG. 6 is a graph illustrating changes of a wafer surface temperature and temperature differences of the susceptor in the conventional dual heater system of FIG. 1.

FIG. 6 is a graph illustrating changes in the surface temperature and temperature difference of the susceptor in the conventional dual heater system of FIG. 1 under various operating conditions. Curves I, II, and III represent temperature differences and curves IV, V, and VI represent the surface temperatures of the susceptor. The temperatures were measured on the surfaces of the susceptors installed in three groups of heater assemblies. The inner heater temperatures of all the heater assemblies were kept constant at 390° C., while the outer heater temperatures were set to 450° C. (curves I and IV), 420° C. (curves II and V), and 400° C. (curves III and VI), respectively. The horizontal axis represents a radius of the susceptor and the vertical axis represents the surface temperature of the susceptor (with respect to curves IV, V, and VI) and a temperature difference of the susceptor (with respect to curves I, II, and III).

Referring to FIG. 6, the curves I, II, and III show that the temperature difference between the central portion and the peripheral portion of the susceptor increases as the temperature of the outer heater is increased. Accordingly, even though the temperature of the outer heater is increased to reduce the temperature difference, in reality, the temperature difference increases as a result thereof. Furthermore, as shown in curves IV, V, and VI, the surface temperature across the susceptor is also increased, even though the temperature of the inner heater is kept constant and only the outer heater temperature is increased. Increasing the temperature of the outer heater therefore fails to reduce the temperature difference on the wafer surface since the increased heat of the outer heater is conducted to the inner heater. The separately controlled outer heater of the conventional system is therefore not able to compensate for the lost heat radiated from the side surface of the susceptor.

To confirm the conclusion that heat conduction from the outer heater raises the temperature of the central portion of the susceptor, the support of the process chamber was modified to block conduction from the outer heater. The same Super-computer was then used to simulate the same deposition conditions as in FIG. 5. The results of the computer simulation are shown in FIGS. 7A to 7C.

FIG. 7A is a cross-sectional view showing the temperature distribution of the modified dual heater system, wherein a portion of the support making contact with the outer heater is removed to block heat conduction from the outer heater to the support. Referring to FIG. 7A, the temperature of an outer heater located in an outer region (C) is increased while the temperature of an inner heater 14 in an inner region (D) is kept constant. As indicated by the hatching densities of the two regions, the computer simulation shows that in this heater assembly configuration, the temperature of the inner region (D) is remarkably low compared to the temperature of the outer region (C). Furthermore, comparing FIG. 7A to FIG. 5, it can be seen that the temperature of the inner region (D) of the modified heater system is much lower than that of the inner region (B) of the conventional heater system.

Accordingly, it is apparent that in the conventional system shown in FIG. 5, heat is conducted from the outer heater 12 to the inner heater 14 through the support 30.

Figure 7B:
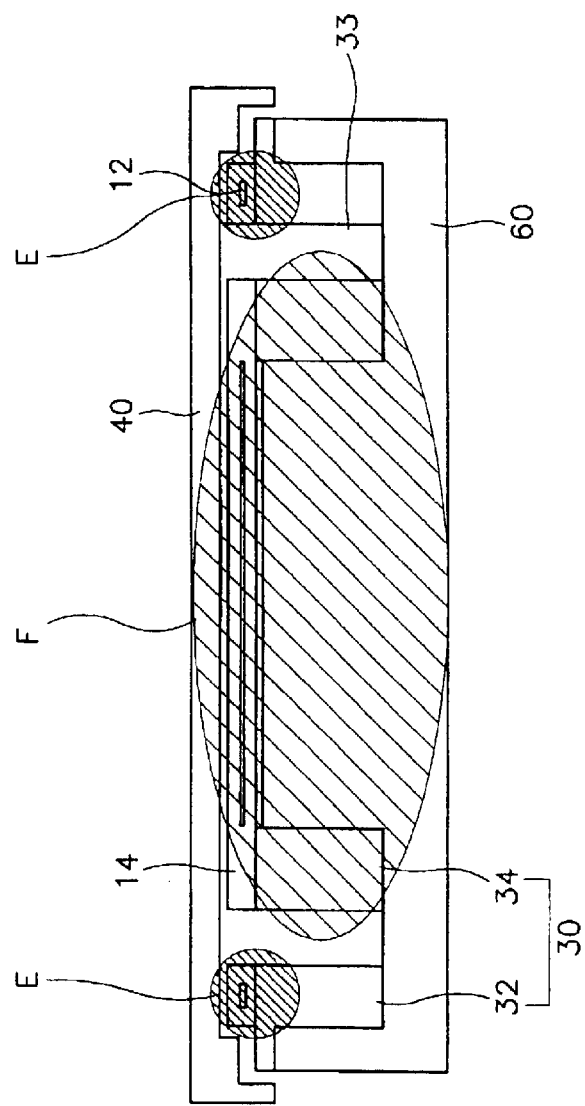

FIGS. 7B and 7C illustrate two additional computer-simulations that were performed on other modified dual heater systems to confirm the above conclusion. Referring to FIGS. 7B and 7C, Since the heater cup is usually installed inside the process chamber, removing the support can lead to corrosion of the heater cup due to deposition gases, thereby reducing the durability of the heater assembly. Accordingly, the heater cup should not be fully removed. Therefore, according to modifications to the support of the conventional dual heater system shown in FIGS. 7B and 7C, the support is divided into an inner support for supporting the inner heater and an outer support for supporting the outer heater. A space is then formed between the inner support and the outer support to block the heat conduction.

FIG. 7B is a cross-sectional view of a modified dual-heater assembly showing the temperature distribution thereof. In the example shown in FIG. 7B, the support 30 is divided into an inner support 34 and an outer support 32, separated by a heat blocking space 33. The heat blocking space 33 is formed between the inner heater 14 and the outer heater 12 to block heat transfer therebetween. The temperature of the outer heater 12 is intentionally increased while the temperature of the inner heater 14 is held constant.

As indicated by densities of the cross-hatching in the different temperature regions, the temperature of an inner region (F) is significantly lower than the temperature of the outer region (E). The computer simulation on the temperature distribution therefore shows that the temperature of the outer support 32 is higher than that of the inner support 34, due to the blocking of heat transfer through the support 30 using the heat blocking space 33. In this example, therefore, heat is not conducted from the outer heater 12 to the inner heater 14 through the medium of the support 30.

FIG. 7C is a cross-sectional view showing the temperature distribution of another modified dual heater system. Referring to FIG. 7C, the heater system of FIG. 7B is modified to include a bolt 36 inserted between the outer heater 12 and the outer support 32 to minimize a contacting surface between the outer heater 12 and the outer support 32.

As shown in FIG. 7C, a hatching density of the inner region (F') is lower than that of the inner region (F) of the earlier example shown in FIG. 7B. Accordingly, the temperature of the inner region (F') in this example is even lower than that of the inner region (F) in the modified dual heater system shown in FIG. 7B without the bolt. Comparing FIG. 7C with FIG. 7B, a contacting region between the outer heater 12 and the outer support 32 is changed from a surface contact (FIG. 7B) to a point contact (FIG. 7C) using the bolt 36. Accordingly, the temperature decrease of the inner region (F') results from the reduction of heat conducted from the outer heater 12 to the outer support 32. The results of these computer simulations indicate that control of the heat conducted from the outer heater to the support is important to obtaining the desired temperature uniformity of the wafer surface.

Figure 8:
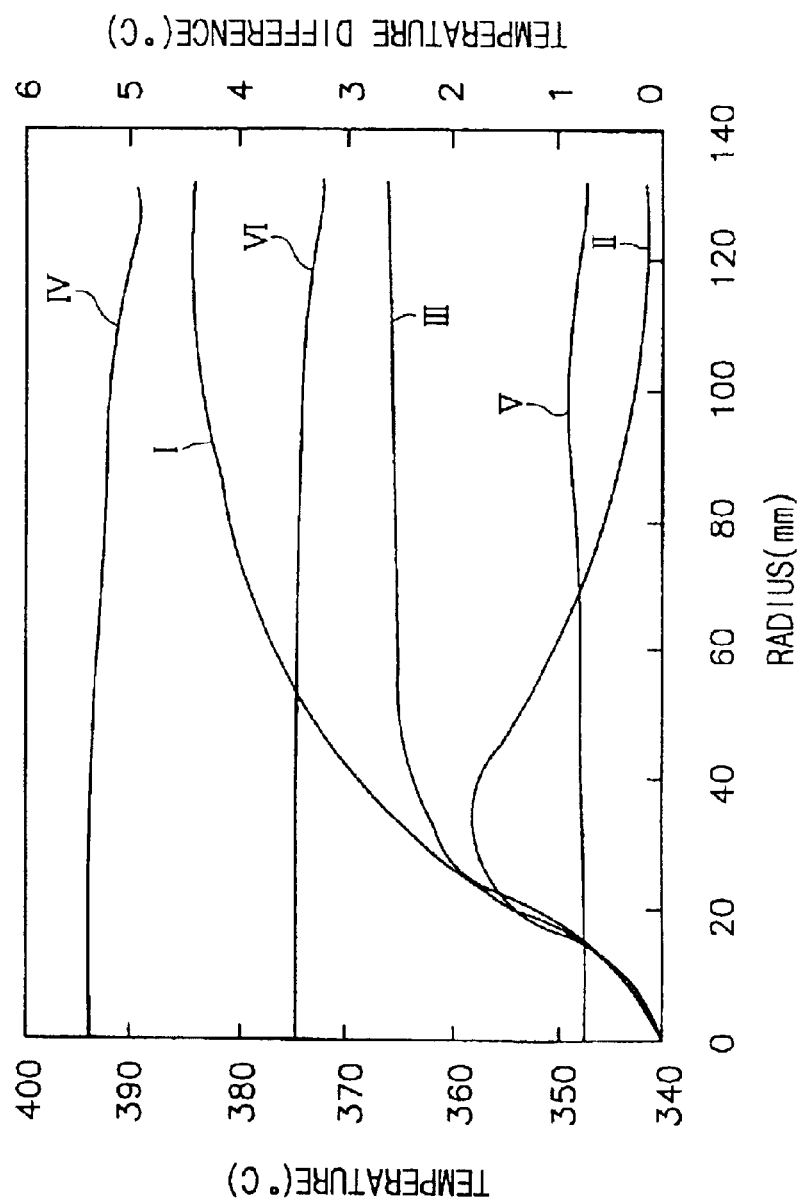
FIG. 8 is a graph showing changes in the wafer surface temperature and temperature differences of the susceptor installed in the modified dual heater systems of FIGS. 7A to 7C.

FIG. 8 is a graph comparing changes in the surface temperature and temperature differences of the susceptor installed in the conventional dual heater system of FIG. 5 and in the modified dual heater systems of FIGS. 7A and 7C. Curves I, II, and III represent the temperature differences and curves IV, V, and VI represent the surface temperatures of the susceptor. The temperatures of the inner heater and the outer heater are respectively set to 390° C. and 450° C. The horizontal graph axis represents a radial distance of the susceptor. The vertical axis of the graph represents a measured temperature (with respect to curves IV, V, and VI) and a temperature difference between the peripheral portion and the central portion of the susceptor (with respect to curves I, II, and III).

Curves I and IV represent operation of the conventional dual heater system of FIG. 5 having a single support. Curves II and V represent operation of the modified dual heater system shown in FIG. 7A, wherein the support is separated into an inner support and an outer support, and wherein the outer support is removed. Curves III and VI represent operation of the modified dual heater system of FIG. 7C, wherein the support is separated into an inner support and an outer support, and wherein a bolt is positioned between the outer support and the outer heater.

Referring to FIG. 8, as can be seen from curve I, the temperature difference between the central portion and the peripheral portion of the conventional dual heater system is fairly significant. As shown by curve II, however, the temperature difference is small when the outer heater is removed. Removal of the outer heater restricts heat conduction from the outer heater to the inner heater so that the heat can be transferred to the inner heater from the outer heater only by radiation through the blocking space. This thereby reduces the temperature difference between the central portion and the peripheral portion of the susceptor.

As described above, however, removal of the outer heater can lead to damage of the heater cup by deposition gas, cleaning gas, or other pollutants present in the processing chamber. Hence, the outer support is preferably not completely removed. A supporting bar, such as a bolt, can be interposed between the outer heater and the outer support to minimize the contact surface between the outer heater and the outer support. As shown by curve III, even though this results in a greater temperature difference than that of curve II, the temperature difference is far less than that of the curve I. The temperature difference of the conventional dual heater system can therefore be reduced by restricting heat conduction from the outer heater to the inner heater through a thermal medium of the support.

As explained, the conventional dual heater system does not provide sufficiently uniform temperature distribution across the surface of the wafer because heat is conducted from the outer heater to the inner heater through the heater system support. The temperature of the central portion of the susceptor is therefore increased when the temperature of the peripheral portion is raised. Changing the structure and shape of the heater therefore does not guarantee temperature uniformity on the wafer surface. If the wafer surface temperature is non-uniform, the thickness of the thin film formed on the wafer surface will also be non-uniform.

Figure 9:
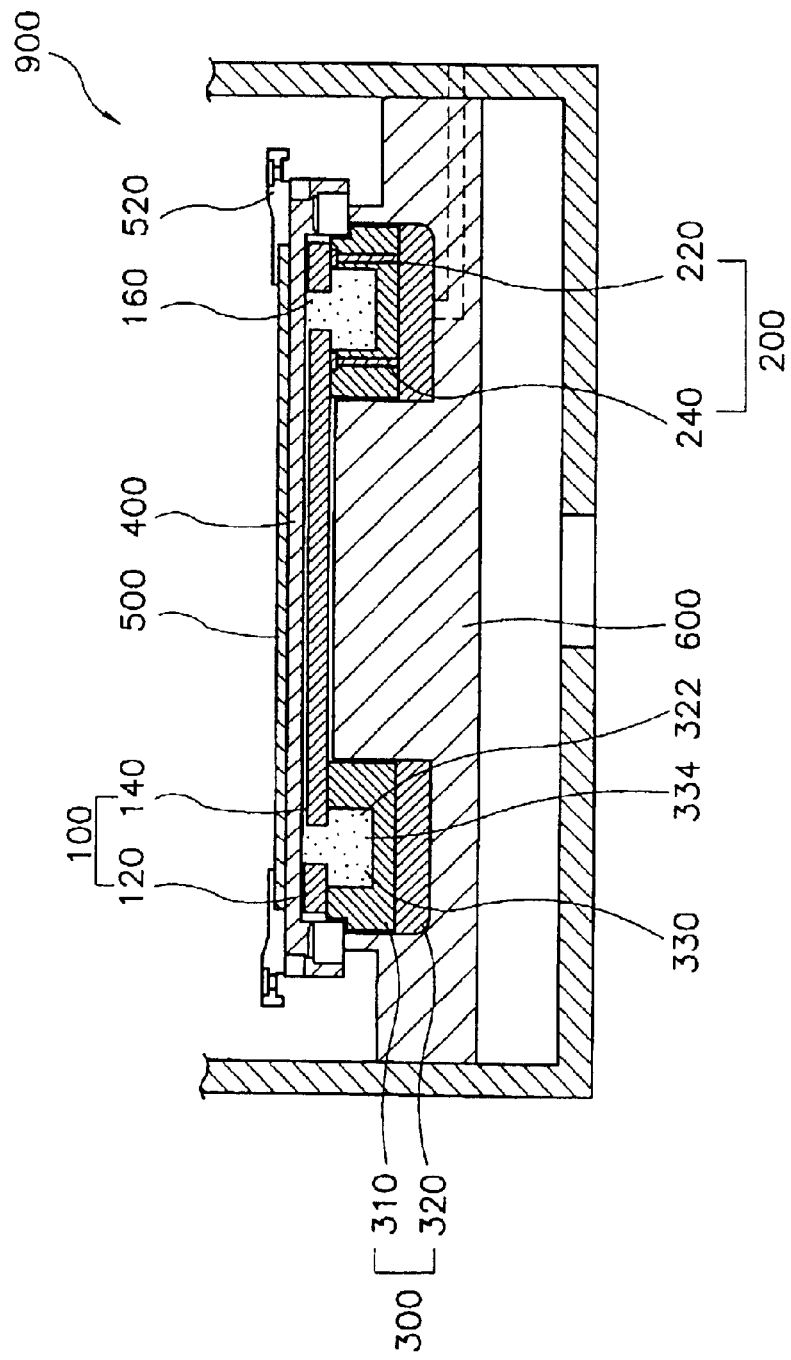
FIG. 9 is a cross-sectional view of a heater assembly for a CVD apparatus according to an embodiment of the present invention.

FIG. 9 is a cross-sectional view of a heater assembly 900 used for chemical vapor deposition (CVD) according to an embodiment of the present invention. In general, in this embodiment, a disk-shaped heater for heating a wafer is separated into an outer heater for heating a peripheral portion of the wafer and an inner heater for heating a central portion of the heater. The outer heater and the inner heater preferably have the same center, with the outer heater formed in a ring shape and the inner heater formed into a disk shape. The outer heater could also, however, be formed into a plurality of concentric rings, so that the heater can be formed having a plurality of rings and a disk. Other configurations are also possible.

Referring to FIG. 9, the heater assembly 900 comprises a susceptor 400. The susceptor 400 provides a first supporting member for supporting a wafer 500, which can provide a substrate for forming a semiconductor device. A heater 100 comprises a heating element disposed under the susceptor 400 to supply heat to the susceptor 400. A power supply 200 supplies electrical current to the heater 100. A support 300 provides a second supporting member for supporting the heater 100. The wafer 500 and susceptor 400 preferably have a disk shape.

The susceptor 400 is disposed between a spraying (or injection) head (not shown) and the heater 100. A center of the susceptor 400 is preferably aligned with a center of the spraying head and a center of the heater 100. The spraying (or injection) head is configured to spray (or inject) a deposition gas onto the wafer 500. Lift fingers 520 are positioned around a peripheral portion of the susceptor 400. The lift fingers 520 maintain a separation distance between the spraying head and the susceptor 400.

The heater 100 is preferably formed having a dual heater system, comprising an outer heater 120 for heating a peripheral portion of the susceptor 400 and inner heater 140 for heating a central portion of the susceptor 400. The outer heater 120 and the inner heater 140 are preferably separated by an isolating space 160 that thermally isolates the outer heater 120 and the inner heater 140 from each other. The inner heater 140 can be configured to heat most of the susceptor 400 with the outer heater 120 configured to heat only an outer circumference of the susceptor 400. The inner heater 140 preferably has a thin disk shape with a thickness of about 0.1 mm to 0.3 mm. The outer heater 120 preferably has a ring shape that is concentric with the inner heater 140, so that the outer heater 120 surrounds the inner heater 140.

The heater 100 is preferably made of a good conductive material, wherein electric current that passes through the heater 100 generates heat by resistance of the heater 100 according to the Joule's law. A surface-protecting layer (not shown) can be formed on a surface of the heater 100 to prevent deposition gas, rinsing gas, or other pollutants generated during a deposition process from damaging the heater 100.

The power supply 200 supplies electric current from an external power source (not shown) to the heater 100. The power supply 200 includes a first power supply 220 for providing power to the outer heater 120 a second power supply 240 for supplying power to the inner heater 140. The first and second power supplies 220, 240 are preferably configured to operate independently so that the temperatures of the outer heater 120 and the inner heater 140 can be set differently. The temperature of the outer heater 120 is preferably set higher than that of the inner heater 140 to compensate for heat radiated from a side surface of the susceptor 400 and provide temperature uniformity across the wafer surface.

The support 300 supports the heater 100. The support 300 preferably comprises quartz, which is a chemically stable material that will not be corroded by acid or an alkali material except for hydrogen fluoride. Hence, the support 300 is not easily corroded by the deposition gas or other by-products of the deposition process. The support 300 is placed in the heater cup 600.

The support 300 can include an upper support element 310 for supporting the heater 100 and a lower support element 320 for supporting the upper support element 310. The lower support element 320 preferably has an injection hole for injecting argon gas towards a bottom surface of the heater 100 to prevent the deposition gas or other by-products of the chemical reaction from flowing to the bottom surface of the heater 100. A connection member (not shown) for electrically connecting the power supply 200 to the external power source can be interposed between the upper support element 310 and the lower support element 320. A heat-shielding portion 330 is preferably formed on a surface of the upper support element 310 for restricting (or masking) heat conduction from the outer heater 120 to the inner heater 140 through the upper support element 310.

The heat-shielding portion 330 preferably comprises a heat-resistant material 334 arranged in a groove 332 of a predetermined depth formed in the upper support element 310. The groove 332 preferably has a width sufficient to allow the heat-resistant material 134 arranged therein to support adjacent portions of the outer heater 120 and the inner heater 140, which are separated by the isolating space 160. Heat conduction from the outer heater 120 to the inner heater 140 through the upper support element 310 is thereby restricted, and the inner heater 140 can be effectively controlled to supply a predetermined temperature to the central portion of the wafer 500.

In the heater assembly 900, when electric current is supplied to the heater 100, heat is generated by the outer and inner heaters 120, 140 according to Joule's Law. The heat generated by the heaters 120, 140 radiates to the susceptor 400 to heat the wafer 500. At that time, the temperature of the outer heater 120 is higher than that of the inner heater 120 to compensate for heat radiated from a side surface of the susceptor 400. The heat-shielding portion 330 restricts heat conduction from the outer heater 120 to the inner heater 140 through the upper support element 310, so that the temperature of the inner heater 140 is not increased by heat conduction from the outer heater 120. Consequently, the heat emitted from the outer heater 120 can sufficiently compensate for the heat lost from the side surface of the susceptor 400 without increasing the temperature of the inner heater 140. The temperature uniformity across the surface of the wafer 500 is thereby improved.

Figure 10B:
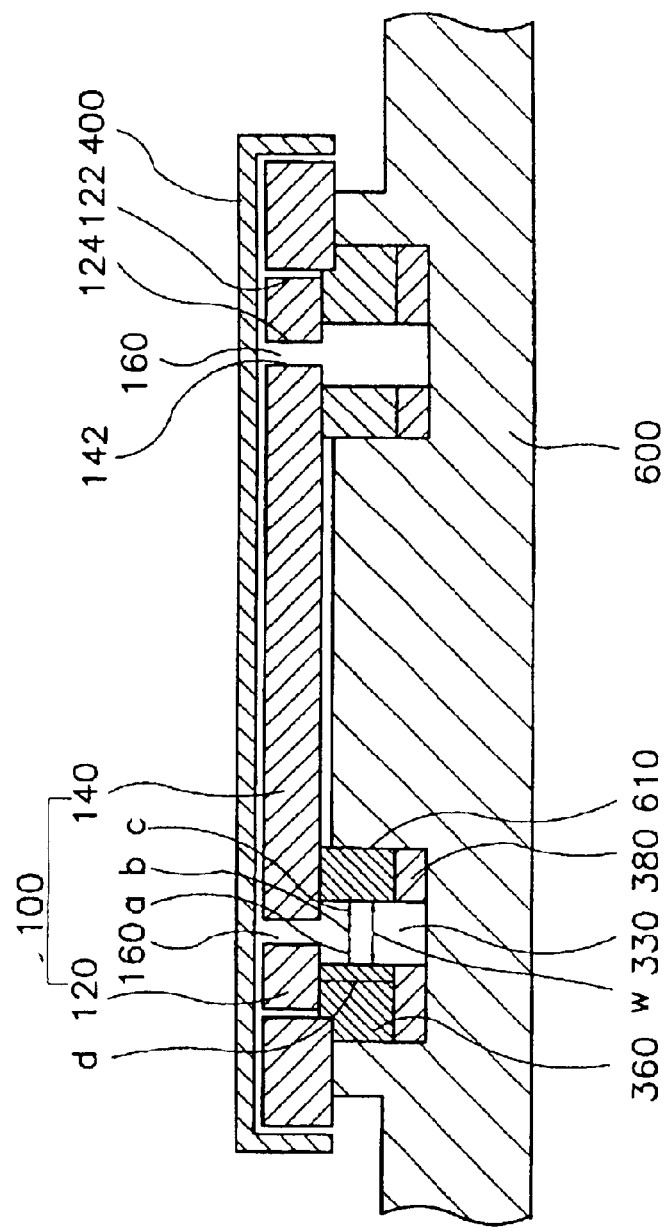
FIGS. 10B to 10D are cross-sectional views showing various possible modifications to the heater assembly of FIG. 10A.

The heat-shielding portion 330 of the heater assembly 900 will now be described in further detail with reference to FIGS. 9 to 10D. FIG. 10A is a schematic cross-sectional view mainly showing the support of the heater assembly 900 of FIG. 9. FIGS. 10B to 10D are cross-sectional views illustrating various modifications to the heater assembly of FIG. 10A. Referring to FIG. 10A, the heat-shielding portion 330 is formed in a ring-shaped groove 332 of a predetermined width (w) and depth (d) in the upper support element 310. Heat-resistant material 334 is arranged in the groove 332 to support an inner edge of the outer heater 120 and an outer edge of the inner heater 140.

In a preferred embodiment, the width (w) of the groove 332 includes a first distance (a), a width of the isolating space 160 (b), and a second distance (c). The first distance (a) is a predetermined distance measured in a radially-outward direction from an inner side surface 124 of the outer heater 120. The second distance (c) is a predetermined distance measured in a radially-inward direction from an outer side surface 142 of the inner heater 140. The first distance (a) is preferably shorter than a distance measured radially-outward from an inner side surface 124 of the outer heater 120 to a midpoint of a line connecting the inner side surface 124 and an outer side surface 122 of the outer heater 120. The second distance (c) could be extended to a boundary wall 610 of the heater cup 600.

The depth (d) of the heat-shielding portion 330 is preferably selected based on the depth required to sufficiently restrict the amount of heat conducted, and can be further based on an allowable stress change of the support 300 resulting from a change in shape of the support 300. The depth (d) can be predetermined within a maximum value of a distance from the upper surface of the upper support element 310 to a bottom surface of the lower support element 320.

As shown in FIG. 10B, when the depth (d) is formed having a distance that extends to the bottom surface of the lower support element 320, the support 300 is effectively divided into an inner support 380 for supporting the inner heater 140 and an outer support 360 for supporting the outer heater 120. When the heater 100 of the heater assembly 900 is made of more than two heaters, the support can be divided into more than two parts corresponding to the number of heaters, and the number of the heat-shielding portion is increased accordingly. In other words, since the heat-shielding portions are disposed between adjacent support parts, the number of shielding portions increase as the number of separated support parts increase.

The groove 332 of the heat-shielding portion 330 extends beneath the outer heater 120 and the inner heater 140. Heat-resistant material 334, such as boron nitride (which has good heat-shielding characteristics), is inserted into the groove 332 to restrict heat transfer. In another embodiment, air can be used as the heat-resistant material 334. The use of air would shield heat conduction while improving process efficiency and reducing a process cost. When air is used as the heat-resistant material 334, the heat-shielding portion 330 is continuously connected with the isolated space 160, and the inner heater 140 and the outer heater 120 are thereby spatially separated from each other.

In these embodiments, even though the temperature of the outer heater 120 increases and more heat is applied to the peripheral portion of the wafer 500, the temperature of the inner heater 140 and the central portion of the wafer 500 can be constantly maintained by restricting heat conduction from the outer heater 120 to the inner heater 140. The wafer is thereby heated evenly with very little temperature difference across the wafer surface.

Figure 10C:
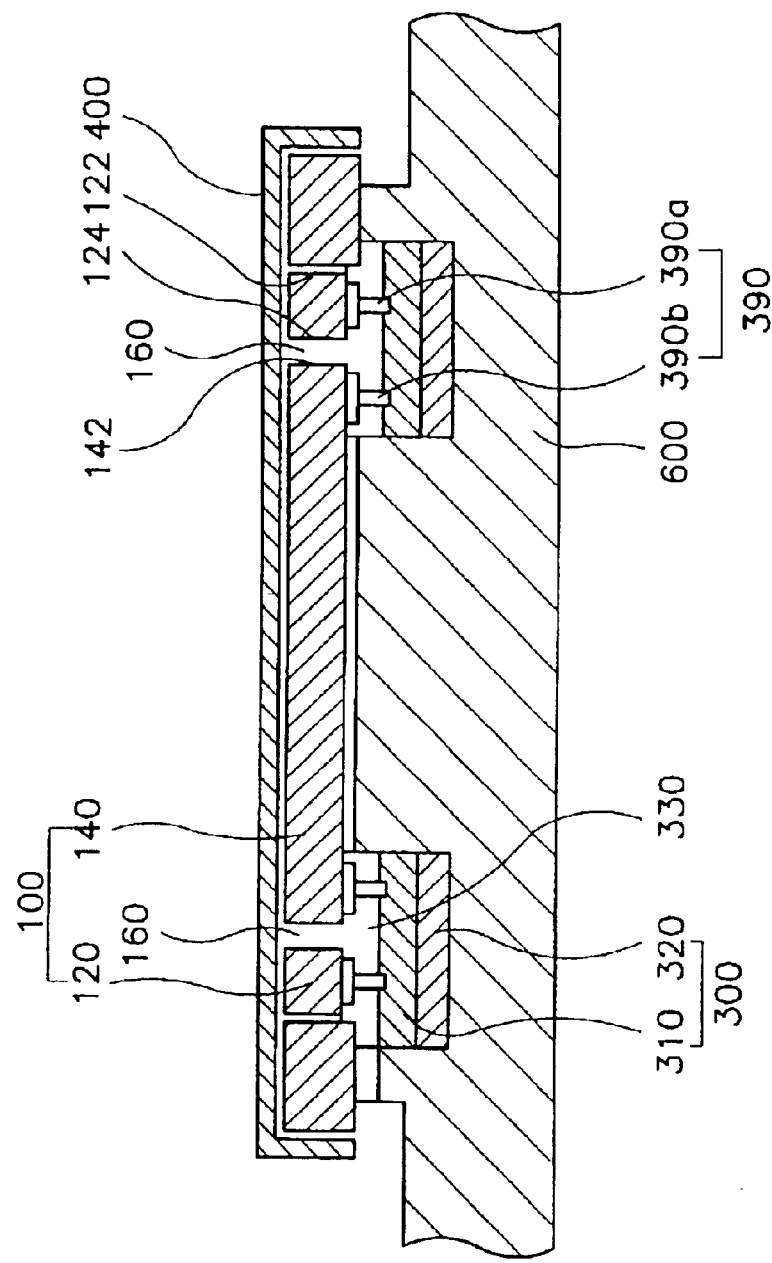

Yet another variation is depicted in FIG. 10C. Referring to FIG. 10C, the upper support element 310 is disposed at a predetermined distance from the lower surface of the heater 100, and a space between the heater 100 and the upper support element 310 functions as a heat-shielding portion 330 to prevent heat from conducting from the outer heater 140 to the inner heater 120. A plurality of supporting bars can be interposed between the upper surface of the upper support element 310 and the heater 100 to support the heater 100 with a minimized contacting surface. First supporting bars can be arranged to support a ring-shaped outer heater 120 along a central circumferential line thereof. Second supporting bars can be arranged to support a disk-shaped inner heater 140 along a peripheral circumferential line thereof. A heat-shielding portion 330 is preferably continuously connected to the isolating space 160 to separate the inner heater 140 and the outer heater 120 from each other and restricted heat conduction therebetween.

Each of the supporting bars can be a bolt that mechanically couples the support 300 to the heater 100. A tap can be formed on the surface of the upper support element 310, with the bolt screwed into the tap. A flat surface can be formed on an upper end of the bolt for supporting the heater 100. The heat-shielding portion 330 can be a heat-resistive material having a good heat-shielding characteristic. The heat-shielding portion 330 is preferably made of air to improve the ease of manufacturing the heater assembly. The supporting bars provide a point contact between the heater 100 and the support 300 to thereby reduce the contact surface of the support 100 with the heater 100. Heat conduction from the outer heater to the inner heater can thereby be reduced, and the corresponding increase in the temperature of the inner heater can be prevented.

Figure 10D:
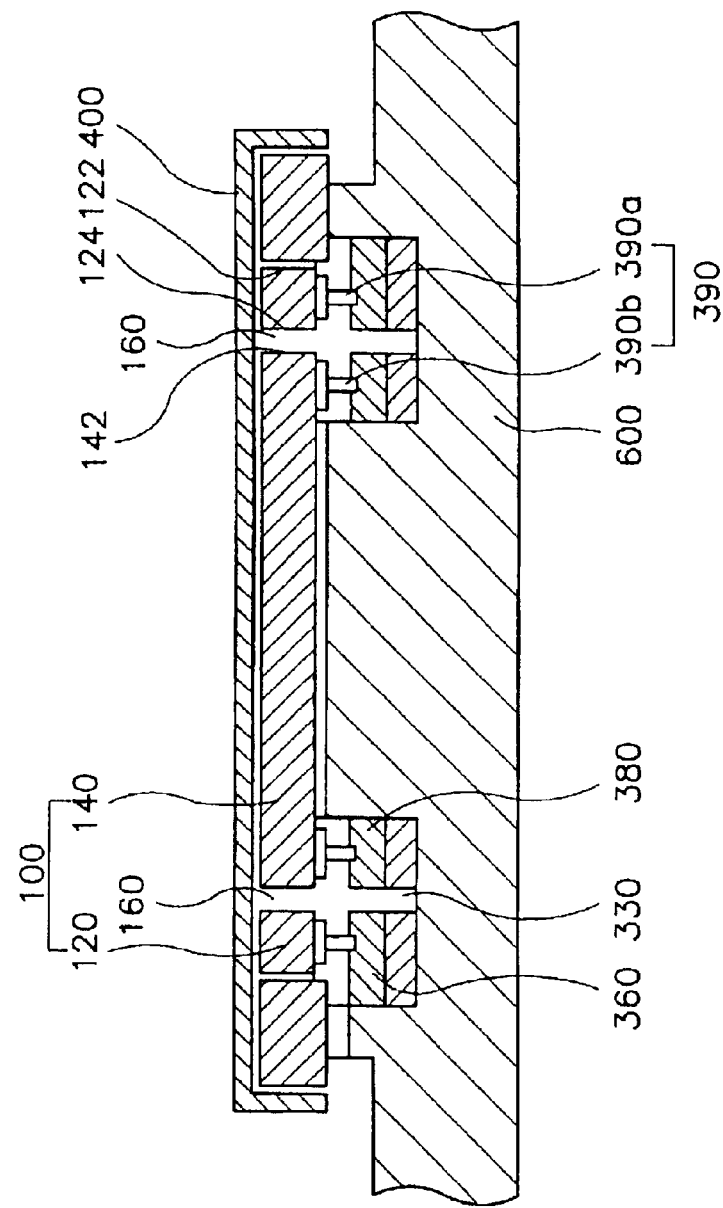

FIG. 10D illustrates a variation to the embodiment shown in FIG. 10C. Referring to FIG. 10D, the support 300 can be divided into an outer support 360 that includes the first supporting bars 390*a* and an inner support 380 that includes the second supporting bars 390*b*. In this way, the heat-shielding portion 330 can be extended to include a space between the outer support 360 and the inner support 380 to thereby improve the effect of heat shielding.

Figure 11:
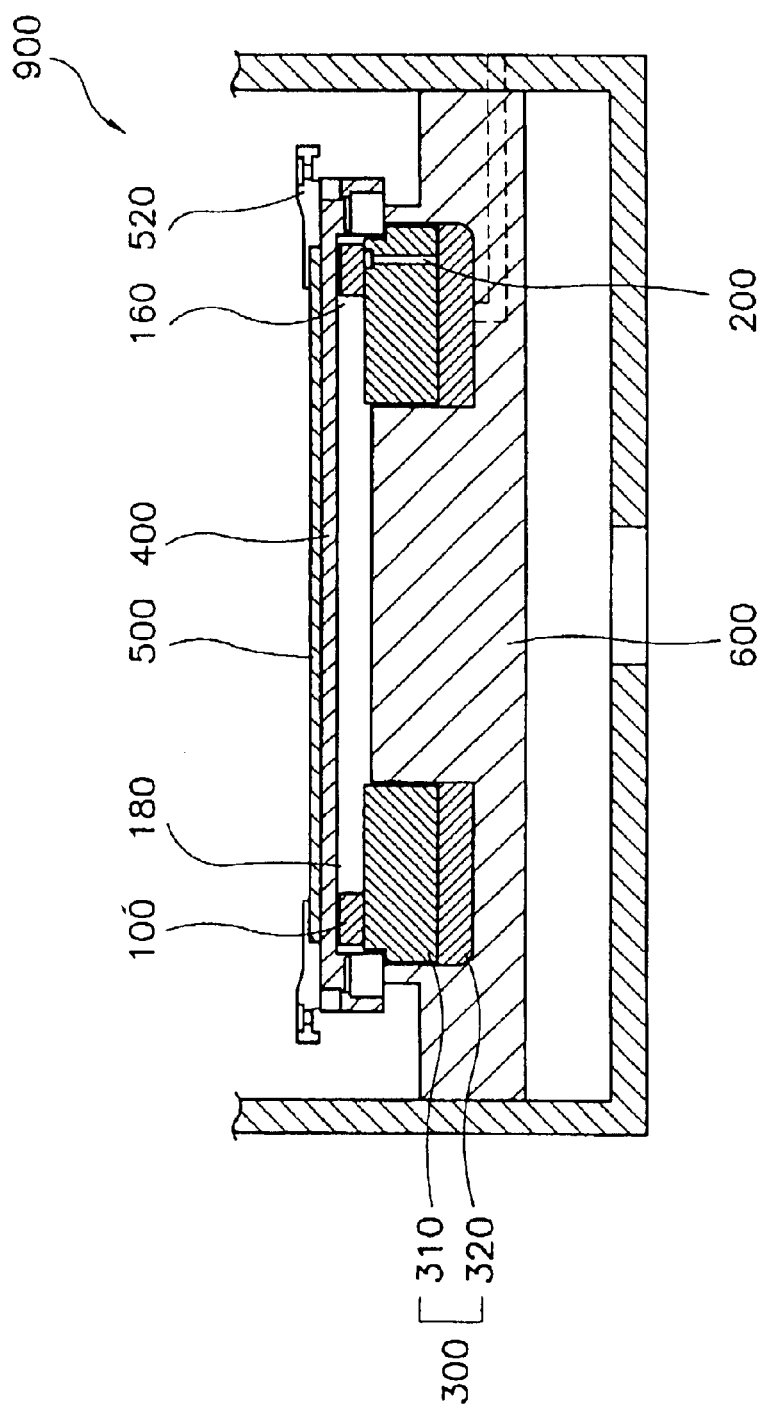
FIG. 11 is a cross-sectional view of a heater assembly of a CVD apparatus according to another embodiment of the present invention.
Figure 12A:
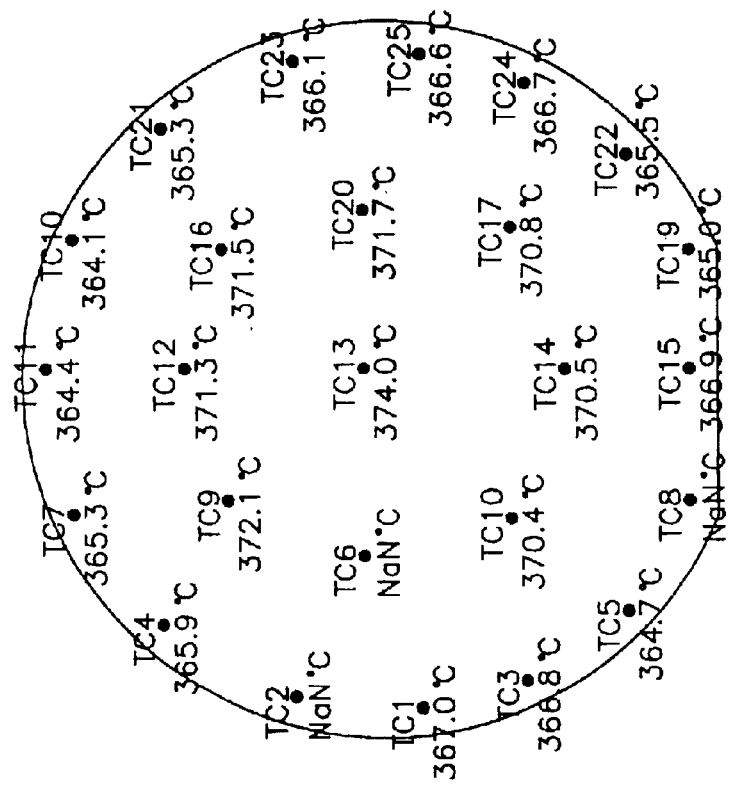
FIGS. 12A to 12D are schematic diagrams illustrating the temperature distribution across a surface of the wafer heated by the dual heater system according to the embodiment of FIG. 9 when the temperature of the outer heater is varied.
Figure 12B:
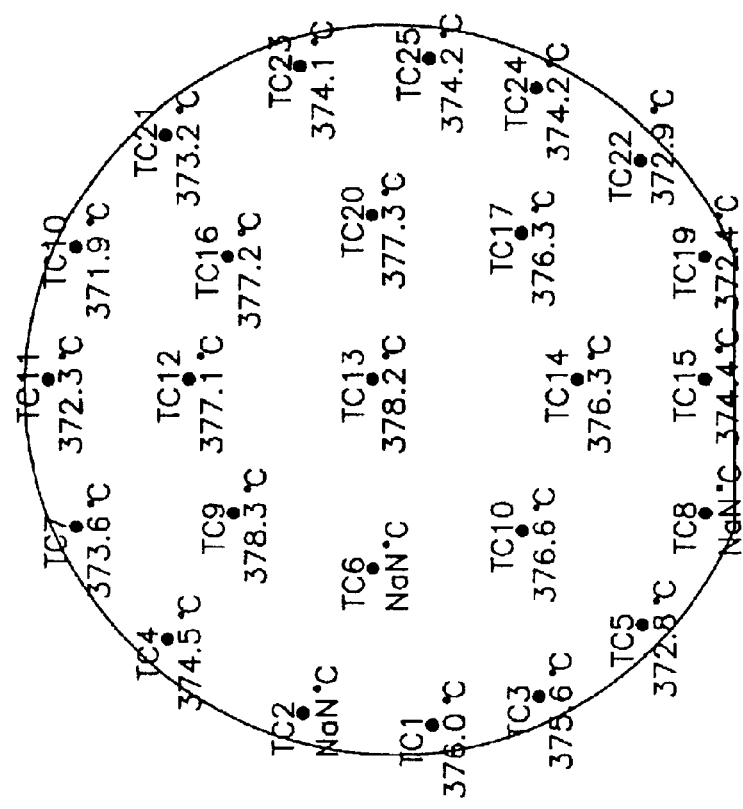
Figure 12C:
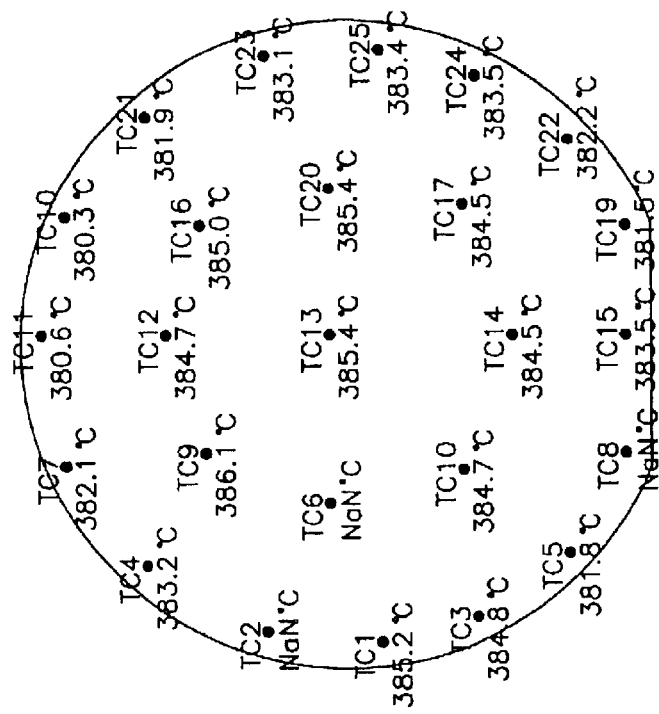
Figure 12D:
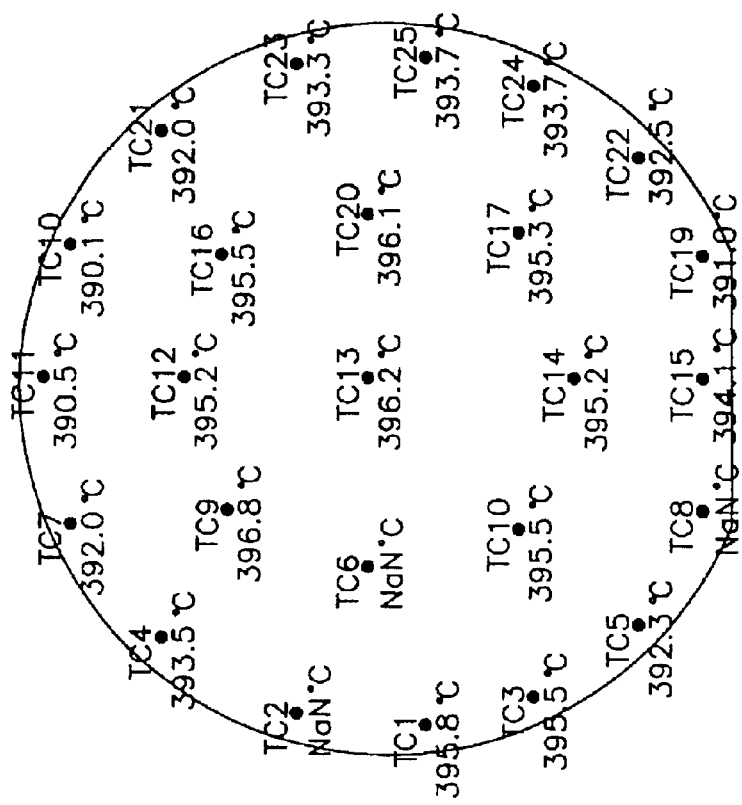
Figure 13A:
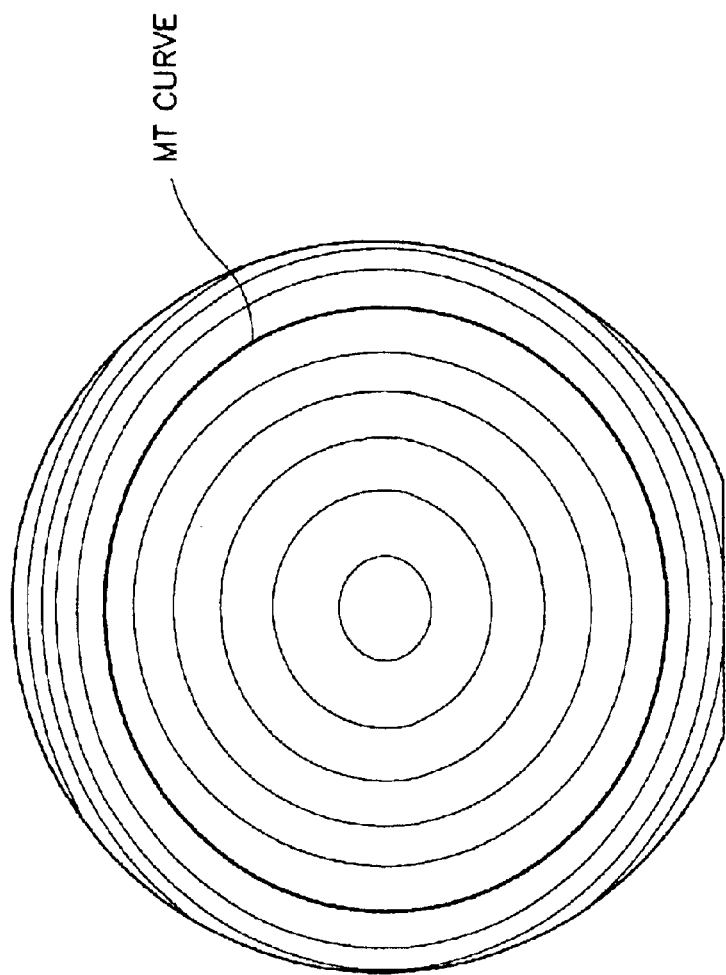
FIGS. 13A to 13D are schematic diagrams illustrating temperature profiles along the wafer surface constructed using the temperature data from FIGS. 12A to 12D.
Figure 13B:
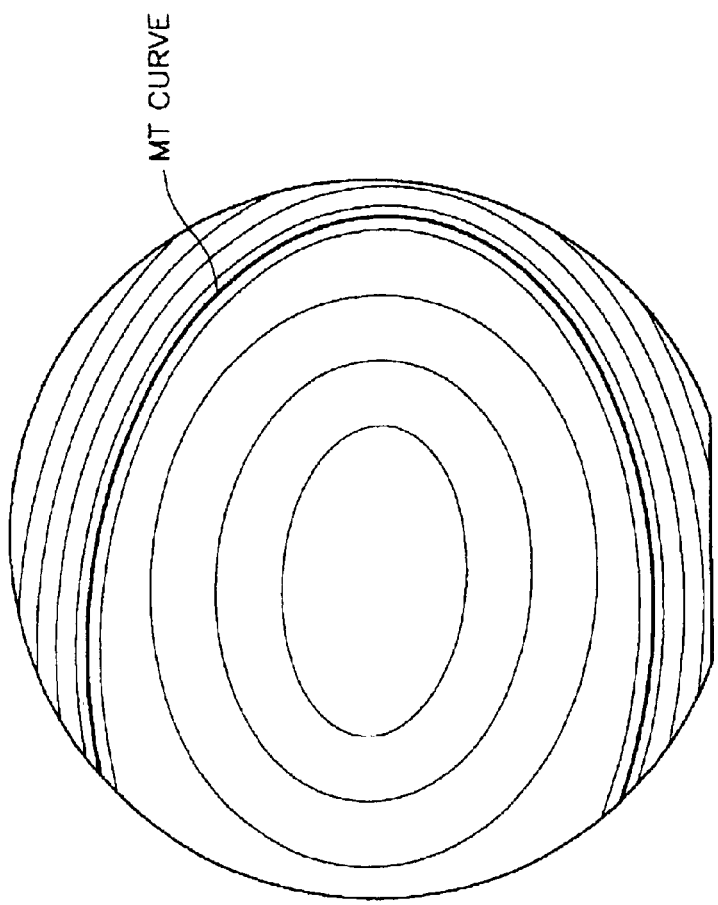
Figure 13C:
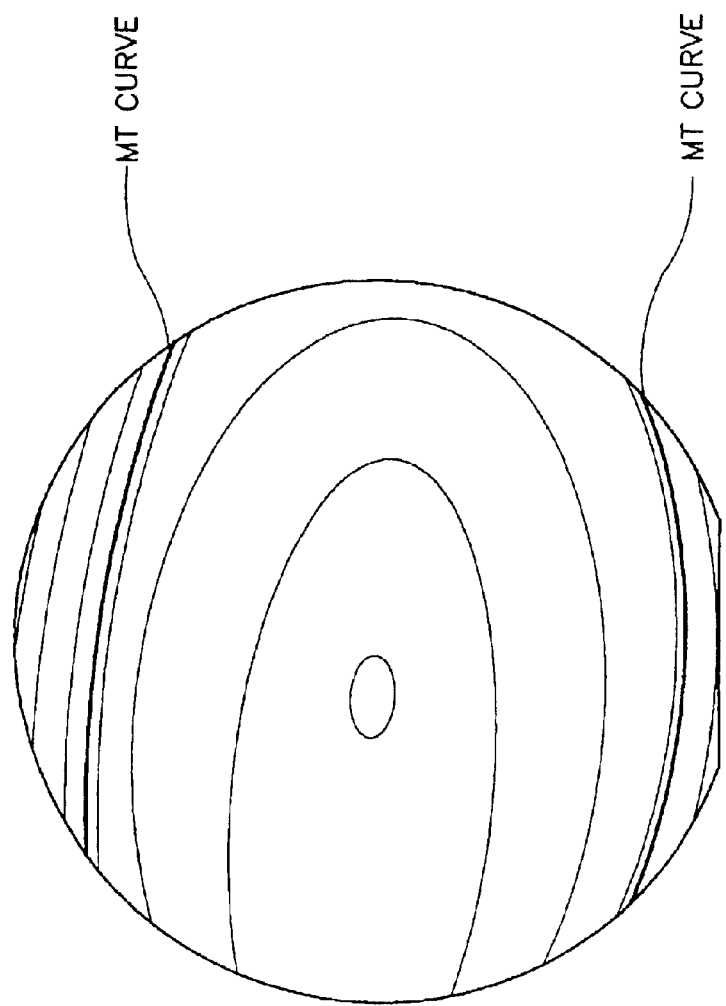
Figure 13D:
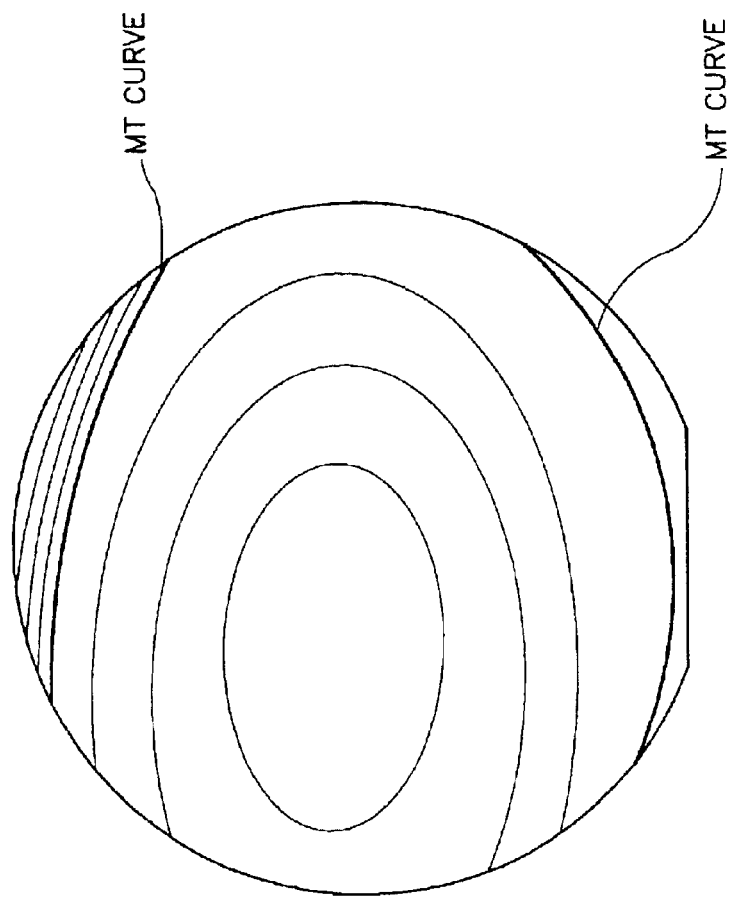

FIG. 11 is a cross-sectional view showing a heater assembly of a CVD apparatus according to yet another embodiment of the present invention. The embodiment of the heater assembly in FIG. 11 is similar in structure to the embodiments described previously with reference to FIG. 9, except with respect to the upper support element and the power supply. Similar components are designated by the same reference numerals, and perform functions similar to those described above.

Referring to FIG. 11, the heater assembly 900' comprises a susceptor 400. The susceptor 400 provides a first supporting member for supporting a wafer 500. The wafer 500 provides a substrate for forming a semiconductor device. A heater 100 includes a heating element disposed under the susceptor 400 for supplying heat to the susceptor 400. A power supply 200 supplies electrical current to the heater 100. A support 300 provides a second supporting member for supporting the heater 100.

The heater 100 is preferably arranged in a ring shape so that only a peripheral portion of the disk-shaped susceptor 400 will be heated. In other words, the inner heater of the dual heater system is removed and no separate heater is provided for heating the central portion of the susceptor 400. Rather, a radiating space 180 is formed inside the ring-shaped heater 100 where the inner heater would otherwise be. A power supply 200 is connected to a lower surface of the heater 100. The power supply 200 provides a power to the heater 100 from an external power source (not shown).

The heater 100 is preferably integrally formed and supported by a support 300 contained in a heater cup 600. The support 300 can include an upper support element 310 for supporting the heater 100 and a lower support element 320 for supporting the upper support element 310. The lower support element 320 preferably has an injection hole for injecting argon gas towards a bottom surface of the heater 100 to prevent deposition gas or other by-products of the chemical reaction from flowing to the bottom surface of the heater 100. A portion of the upper surface of the support 300 is arranged under the susceptor 400 without contacting the heater 100 to form the radiating space 180 between the support 300 and the susceptor 400.

When electric current is supplied to the heater 100, resistive heat is generated by the heater 100 according to Joule's Law. Heat from the heater 100 is radiated to the susceptor 400 and conducted to the support 300. Heat is also radiated through the radiating space 180. A lower surface of the susceptor 400 arranged above the radiating space 180 is thereby heated through the radiated heat. Accordingly, while the peripheral portion of the susceptor 400 is directly heated by conduction from the heater 100 and the temperature thereof is therefore relatively high, an central portion of the susceptor 400 is indirectly heated by radiating heat conducted from the heater 100 to the support 300. The temperature of the central portion is therefore relatively low. Heat lost from a side surface of the susceptor 400 to the surroundings is thereby sufficiently compensated for, and temperature uniformity may be achieved across the wafer surface.

Various temperature measurements were performed on wafer surfaces in the above embodiments to confirm the reduction in temperature difference of the wafer surface using a heater assembly having a modified support structure. FIGS. 12A to 12D are schematic plan views of a wafer surface indicating temperature distribution across the wafer surface. In FIGS. 12A to 12D, the wafer is heated using the dual heater system of FIG. 9 wherein the temperature of the outer heater is set to different temperatures while holding the temperature of the inner heater constant.

More specifically, in FIGS. 12A to 12D, the temperature was measured at 25 spots on a test wafer arranged in a CVD apparatus having the modified heater assembly of FIG. 9. In FIGS. 12A to 12D, the temperature of the inner heater was maintained at 395° C., while the temperature of the outer heater was set to 385° C., 395° C., 405° C., and 415° C., respectively. FIGS. 13A to 13D are schematic diagrams of temperature profiles of the wafer surface based on the temperature data from FIGS. 12A to 12D. In FIGS. 13A to 13D, the thick solid lines provide a mean temperature (MT) curve, which indicates a mean temperature of the wafer surface. The measured temperature data from FIGS. 12A to 12D is reproduced in Table 1.

Referring to FIGS. 12A to 12D and Table 1, as the temperature of the outer heater was increased, the maximum and minimum temperatures of the wafer surface were also simultaneously increased. The mean temperature of the wafer surface was also therefore increased. Furthermore, when the temperature of the outer heater was set to 395° C. or 415° C., the temperature difference across the wafer surface was about half as great as when the outer heater had a conventional temperature of 385° C.

Referring to FIGS. 13A to 13D, as the temperature of the outer heater was increased, the separation between lines in the temperature profile increased. The widening of spaces between lines in the temperature profile indicates that the temperature became more uniform across the wafer surface as the temperature increased. These diagrams therefore provide visual confirmation that temperature uniformity across the wafer surface was improved.

In addition, as the temperature difference between the central portion and the peripheral portion decreases, the MT curve becomes positioned more closely to an edge of the wafer. If the temperature difference was zero, the MT curve would not appear since it would coincide with a circumference of the wafer. In these figures, as the temperature difference is reduced, the MT curve no longer forms a circle, but instead forms an arc.

As illustrated by these figures, increasing the temperature of the outer heater can improve temperature uniformity across the wafer surface when heat is not conducted from the outer heater to the inner heater. In other words, increased heat supplied by the outer heater compensates for heat lost from the side surface of the susceptor to the surroundings without increasing the temperature of the inner heater. The temperature difference across the wafer surface is thereby reduced.

Figure 14:
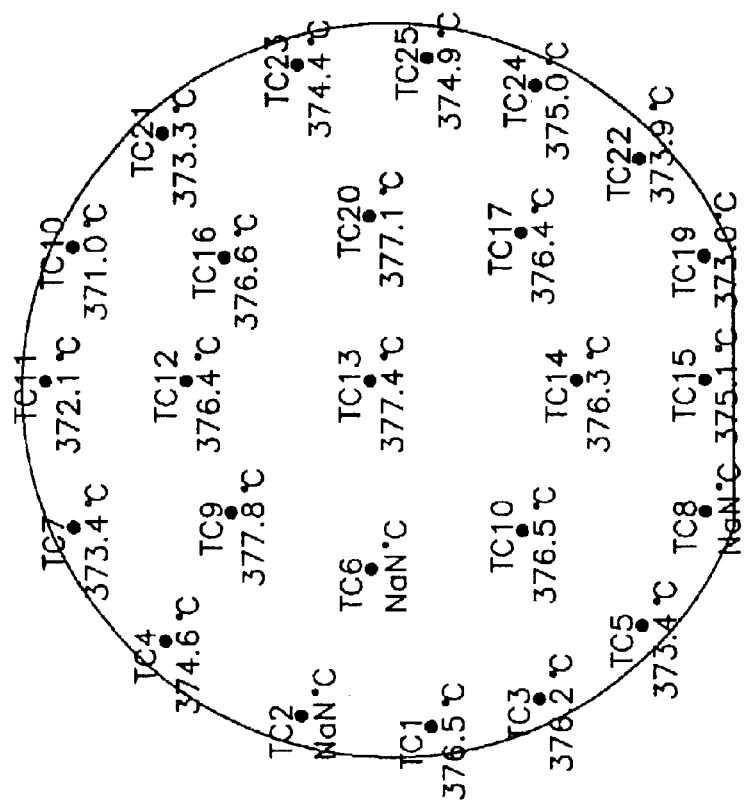
FIG. 14 is a schematic diagram illustrating temperature distribution across a surface of a wafer heated by the heater system of FIG. 11.

FIG. 14 is a schematic plan view of a wafer surface illustrating the temperature distribution across the wafer heated by the heater system of FIG. 11. Referring to FIGS.

Figure 15:
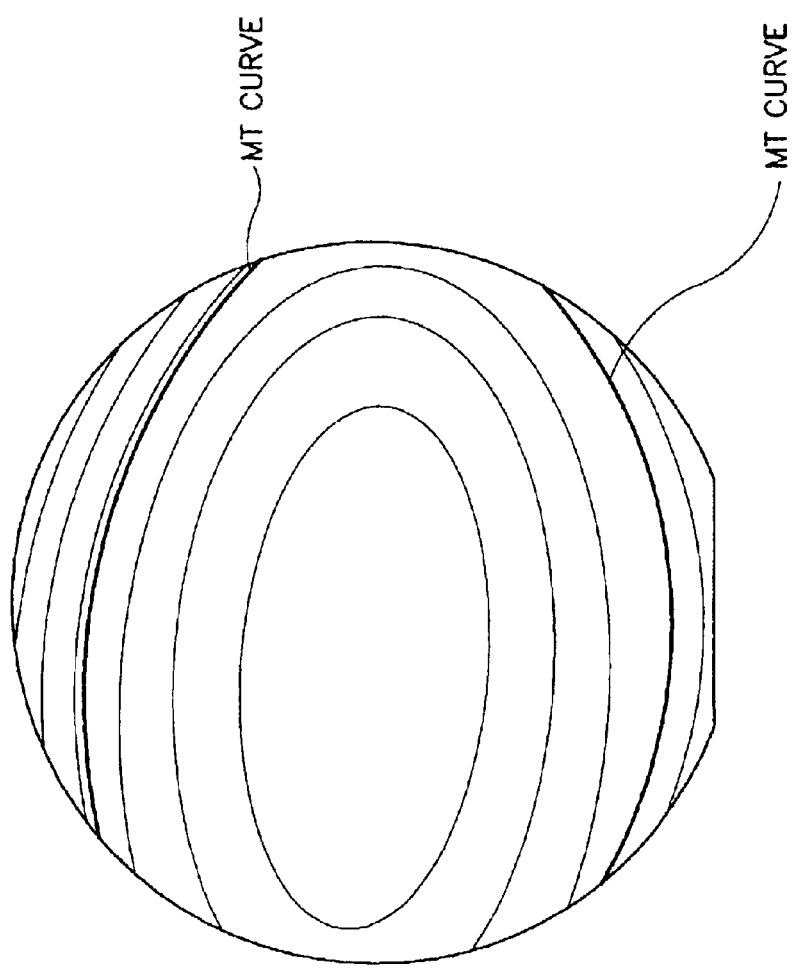
FIG. 15 is a schematic diagram illustrating the temperature profile of the wafer surface constructed using the temperature data shown in FIG. 14.

11 and 14, the temperature was measured at 25 spots on a test wafer in a deposition apparatus having a ring-shaped heater 100. The temperature of the heater 100 was maintained at 395° C. FIG. 15 is a schematic plan view of a wafer surface illustrating a temperature profile of the wafer surface using the temperature data from FIG. 14. The thick solid line is a mean temperature curve representing a mean temperature of the wafer surface. The temperature data is also recorded in Table 1.

Referring to FIG. 14 and Table 1, the maximum and minimum temperatures of the wafer surface heated by the ring-shaped heater 100 of FIG. 11 set to 395° C. are respectively 377° C. and 372° C., and the mean temperature is 374° C. Compared with FIG. 12B, which indicates the temperature distribution of a wafer heated by the dual heater of FIG. 9 with the temperature of the outer heater set to 395° C., the mean temperature of the wafer surface was the same, but the maximum temperature at the wafer center was reduced. The temperature difference across the wafer surface was also reduced to only 5° C. Furthermore, compared with the temperature profile in FIG. 13B, the separation between the temperature profile lines in FIG. 15 is much wider, and the arcs representing the MT curve are located closer to the peripheral portion of the wafer. This comparison visually confirms that the temperature difference across the wafer surface can be even further reduced using the embodiment of FIG. 11. These results also indicate that when only one heater is required to heat the wafer, a ring-shaped heater arranged to heat the peripheral portion of the susceptor can reduce the temperature difference across the wafer surface.

As explained previously, Table 1 includes temperature difference as well as mean temperature data for wafer surfaces heated according to various embodiments of the invention. The data contained in Table 1 was obtained from the temperature data found in FIGS. 12A to 12D and FIG. 14.

TABLE 1

| Category | Specimen | | | | |
| --- | --- | --- | --- | --- | --- |
| | I | II | III | IV | V |
| Maximum Temperature (° C.) | 374 | 378 | 385 | 396 | 377 |
| Minimum Temperature (° C.) | 364 | 372 | 380 | 390 | 372 |
| Mean Temperature (° C.) | 368 | 374 | 382 | 392 | 374 |
| Temperature difference | 10 | 6 | 5 | 6 | 5 |

In Table 1, specimens I, II, III, and IV correspond to FIGS. 12A through 12D, respectively. The data corresponding to specimen V were obtained by analyzing the results from FIG. 14. Referring to Table 1, as the temperature of the outer heater increases, the temperature difference across the wafer surface is reduced, and the mean temperature of the wafer increased.

Unfortunately, if the mean temperature of the wafer is too high, an excessive amount of tungsten suicide (WSix) grain may be generated during the tungsten silicide deposition process. Over-generation of tungsten silicide can lead to a process failure called a "bridge failure." When the tungsten suicide is deposited at a high temperature, a plurality of excess silicon atoms are generated. The excess silicon atoms are oxidized in a subsequent process and thereby formed into silicon oxide (SiO2). The silicon oxide pushes the tungsten silicide off a gate line and a pad polysilicon may make contact with the pushed tungsten silicide. The bridge failure is a contact failure caused by the contact between the pad polysilicon and the tungsten silicide.

When the tungsten silicide (WSix) is deposited at a low temperature to protect the tungsten silicide grain and prevent the bridge failure, the temperature difference may be significant. If the temperature of the peripheral portion of the wafer is much lower than that of the central portion of the wafer, the tungsten suicide (WSix) will be deposited on the peripheral portion of the wafer at a relatively lower temperature than the central portion of the wafer. When the deposition process takes place at a low temperature, a plurality of excess tungsten atoms are generated. A bonding force between the deposited layer and a lower layer disposed under the deposited layer is thereby weakened and internal stresses in the deposited layer are increased. Consequently, the deposited layer and the lower layer may become separated from each other. This process defect is called "delamination" or "lifting."

In order to improve the temperature uniformity of the wafer surface as well as the process efficiency, the temperature of the wafer surface should be set between a first temperature (to prevent bridge failure) and a second temperature (to prevent lifting). When the temperature of the wafer surface is uniformly set outside of the temperature range established between the first temperature and the second temperature, bridge failure or lifting will occur in all of the cells fabricated in the wafer.

Figure 16:
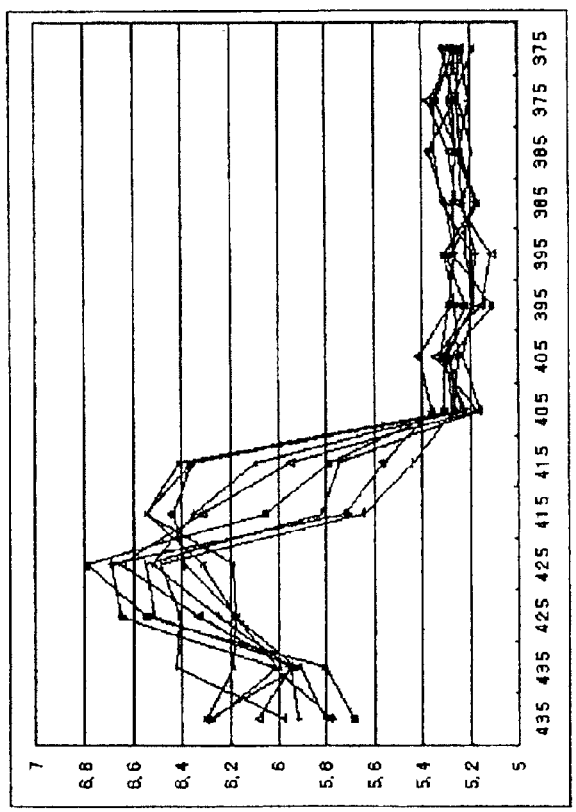
FIG. 16 is a graph showing a relationship between a metapulse density of the tungsten silicide (WSix) and a temperature of a wafer surface.

A metapulse density of the tungsten silicide (WSix) was measured to determine an upper temperature, below which excess silicon atoms are not generated. FIG. 16 is a graph illustrating a relationship between the metapulse density of tungsten silicide (WSix) and the temperature of the wafer surface. In the graph shown in FIG. 16, the horizontal graph axis represents the temperature of the inner heater (e.g., such as installed in a GENUS 7000 apparatus, version 3.9). The vertical axis represents the metapulse density. The metapulse density is measured at an arbitrary point on the wafer surface.

Referring to FIG. 16, the metapulse density rapidly increases when the temperature of the inner heater is above 405° C. When the temperature of the inner heater was 405° C., the density of metapulse ranged between about 5.2 to 5.4. When the temperature of the inner heater was 415° C., however, the metapulse density rapidly increased to between about 6.2 to 6.8. The metapulse density was stable at temperatures below 405° C. When the metapulse density was stable, the temperature test shows that the mean temperature of the wafer surface was about 370° C.

In other words, when the temperature of the wafer surface is more than about 370° C. and the tungsten silicide (WSix) is deposited at a high temperature, the deposited layer may include a plurality of excess silicon atoms and a grain or bridge failure may be generated. ILS (In-Line SEM) photographs taken at different heater temperatures confirm this. An ILS photograph is a kind of scanning electron microscope (SEM) photograph taken above a specimen.

FIG. 17 provides a plurality of ILS photographs that show a density of the tungsten silicide (WSix) grain at various heater temperatures. The temperature was measured when the tungsten silicide (WSix) was deposited. Referring to FIG. 17, the density of the particle-shaped grain 810 increased as the temperature of the heater increased. When the temperature of the heater was 400° C. or 405° C., the grain 810 was very sparse. When the temperature of the heater was 410° C. or 415° C., however, the grain 810 became more dense. These ILS photographs therefore confirm that the density of the grain 810 rapidly increased at temperatures above 405° C.

Furthermore, a reflect index (RI) is reduced as the density of the grain 810 increased. The RI is a reflexibility ratio between a processing-wafer and a processed-wafer when the reflexibility of the processed-wafer is assumed to be 100. The reflexibility of the processing-wafer is measured at an arbitrary time during a particular process, and the reflexibility of the processed-wafer is measured when the particular process is finished. The RI is high at the beginning of the process since processing pollutants are few. The RI then gradually increases and finally converges toward 100 as the particular process moves forward. Hence, each separate process for fabricating a wafer has a respective standard RI, and a process failure of each process is determined according to its RI.

As shown in FIG. 17, the RI of the deposition process was reduced as the deposition temperature increased. More particularly, as the temperature increased, the density of the grain 810 and the excess silicon inside the deposited layer increased accordingly. As a result, the RI decreased. The RI should be in a range of about 119 to 122, and is most preferably around 122. The reduction of the RI due to the increase of excess silicon can also be confirmed using an auger electron spectroscope (AES) test.

When tungsten silicide (WSix) is deposited, excess silicon is generated when the temperature is high and excess tungsten is generated when the temperature is low. The ratio of excess silicon to excess tungsten (Si/W ratio) increases as the deposition temperature increases. AES tests for measuring the Si/W ratio were performed under different deposition temperatures to confirm that excess silicon increased as the temperature increased. The AES test is usually used for inspecting the pollutants present on a layer or analyzing a composite ratio of compositions of the layer. The AES test apparatus shoots an electron beam and reads the kinetic energy of an auger electron emitted by the electron beam to thereby analyze chemical elements of a specimen.

Figure 18B:
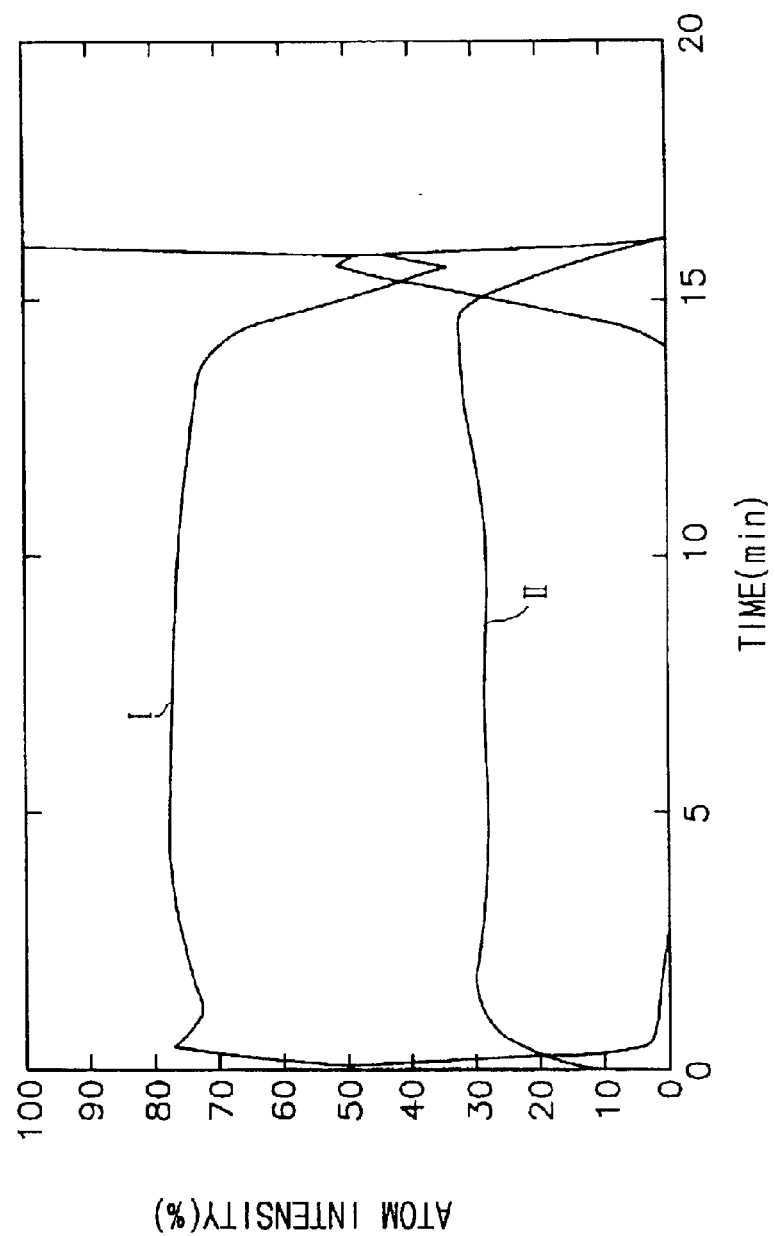
Figure 19B:
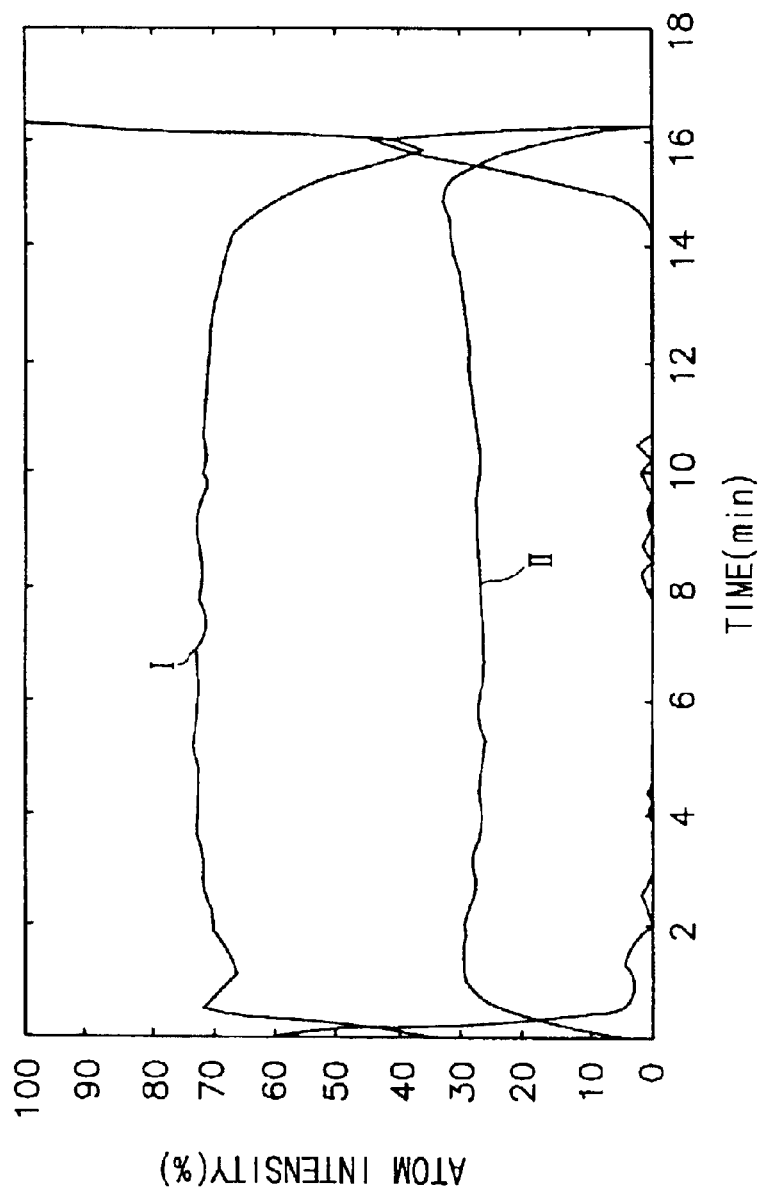

FIGS. 18A and 18B are graphs showing the results of an AES test when the temperature of the heater was 405° C. FIGS. 19A and 19B are graphs showing the results of an AES test when the temperature of the heater was 395° C. The horizontal axis represents a shooting time of the electron beam on the wafer surface. The vertical axis represents an intensity of the auger electrons. FIGS. 18A and 19A are graphs indicating the Si/W ratio before the diffusion of implanted ions, and FIGS. 18B and 19B are graphs indicating the Si/W ratio after the diffusion of implanted ions. Curve I represents the intensity of the silicon atom and curve II represents the intensity of the tungsten atom.

Referring to FIGS. 18A, 18B, 19A, and 19B, curve I is always above curve II regardless of the diffusion of implanted ions, which indicates that the silicon atoms are always richer than the tungsten atoms on the wafer. The Si/W ratio was 2.51 before the diffusion of implanted ions and 2.65 after the diffusion of implanted ions when the temperature of the heater was 405° C. When the temperature of the heater was 395° C., the Si/W ratio was 2.43 before the diffusion of implanted ions and 2.64 after the diffusion of implanted ions. Accordingly, the density of the silicon becomes higher than that of the tungsten as the heater temperature increases, and as a result, the density of the grain is also increased. The RI is therefore reduced as the heater temperature increases. The heater temperature is preferably controlled so that the Si/W ratio is about 2.5.

In order to prevent bridge failure and lifting during deposition process, the excess silicon should be controlled to some extent by controlling the deposition temperature. The proper temperature can be determined using the metapulse density, the RI, and the Si/W ratio. The heater assembly according to one embodiment of the present invention is controlled to have a deposition temperature resulting in a metapulse density below about 6.2, an RI in a range of approximately 117 to 127, and a Si/W ratio in a range about of 2.2 to 2.6. In a most preferred embodiment, the mean temperature of the wafer surface is kept in a range of about 350° C. to 380° C. To accomplish this, the heater temperature of the heater assembly can be set in a range of between about 390° C. to 420° C. These parameters can, of course, be modified based on practical processing conditions.

In summary, according to various aspects of the present invention, a conventional support for supporting a dual heater assembly can be modified to prevent heat from being conducted between the heaters. Temperature uniformity on the wafer surface can thereby be improved. In addition, a metapulse density, a RI, and a Si/W ratio can be properly set by controlling the temperature of the wafer surface. The layer can be uniformly deposited in thickness or density to reduce the possibility of bridge failure and to prevent lifting during the deposition process.

Although several embodiments of the present invention have been described in detail above, it will be apparent to those skilled in the art that various changes, substitutions, and alterations can be made thereto without departing from the spirit and scope of the invention as defined by the appended claims. These claims should therefore be interpreted to cover all such variations and modifications.

What is claimed is:

1. A heater assembly for heating a semiconductor wafer, comprising:
a first supporting member for supporting the wafer;
a plurality of heating elements disposed below said first supporting member for heating the wafer, said heating elements being thermally isolated from one another; and
a second support disposed below said heating elements for supporting said heating elements, said second support including a heat-shielding portion that restricts heat conduction between said heating elements.

2. The heater assembly according to claim 1, wherein said heat-shielding portion comprises heat-resistant material arranged in a groove formed in said second support, said heat-shielding portion supporting a peripheral portion of adjacent heating elements.

3. The heater assembly according to claim 2, wherein a depth of said groove is equal to a thickness of said second support.

4. The heater assembly according to claim 2, further comprising a plurality of support bars interposed between an upper surface of said second supporting member and one or more of said heating elements, said support bars configured to reduce a contact area between said second supporting member and said heating elements.

5. The heater assembly according to claim 4, wherein the support bars comprise a bolt that mechanically couples said second supporting member to said heating element.

6. The heater assembly according to claim 2, wherein said heat-resistant material comprises air or boron nitride.

7. The heater assembly according to claim 1, wherein said heating elements comprise resistive heaters that generate heat by electrical resistance according to Joule's law.

8. A heater assembly of an apparatus for manufacturing a semiconductor device, said heater assembly comprising:
a susceptor for supporting a wafer;

a plurality of heaters disposed under said susceptor for heating said wafer, said heaters being separated from each other by isolating spaces; and a support disposed below said heaters for supporting said heaters, said support including a beat-shielding portion to restrict heat conduction between said heaters.

9. The heater assembly according to claim 8, wherein said heat-shielding portion comprises a heat-resistant material arranged in a groove formed on said support, said heat-shielding portion supporting adjacent portions of said heaters.

10. The heater assembly according to claim 9, wherein said groove is formed to a bottom surface of said support, such that a depth of said groove is equal to a thickness of said support.

11. The heater assembly according claim 9, further comprising a plurality of support bars arranged between said support and said heaters to reduce a contact surface area between the support and the heaters.

12. The heater assembly according to claim 11, wherein said support bars comprise bolts that mechanically couple said heaters to said support.

13. The heater assembly according to claim 9, wherein said heat-resistant material comprises air or boron nitride.

14. The heater assembly according to claim 8, wherein during operation a temperature of each of said heaters is maintained in a range of about 390° C. to 420° C.

* * * * *

UNITED STATES PATENT AND TRADEMARK OFFICE
CERTIFICATE OF CORRECTION

PATENT NO. : 6,838,645 B2
DATED : January 4, 2005
INVENTOR(S) : Choi et al.

It is certified that error appears in the above-identified patent and that said Letters Patent is hereby corrected as shown below:

Column 16,
Line 6, replace "tungsten suicide" with -- tungsten silicide --.

Signed and Sealed this

Third Day of January, 2006

JON W. DUDAS
*Director of the United States Patent and Trademark Office*